US010194111B2

(12) United States Patent
Inada

(10) Patent No.: US 10,194,111 B2
(45) Date of Patent: Jan. 29, 2019

(54) IMAGE SENSOR, ELECTRONIC APPARATUS, COMPARATOR, AND DRIVE METHOD

(71) Applicant: SONY CORPORATION, Tokyo (JP)

(72) Inventor: Yoshiaki Inada, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/989,543

(22) Filed: May 25, 2018

(65) Prior Publication Data
US 2018/0278874 A1    Sep. 27, 2018

Related U.S. Application Data

(63) Continuation of application No. 15/311,701, filed as application No. PCT/JP2015/065191 on May 27, 2015.

(30) Foreign Application Priority Data

Jun. 9, 2014   (JP) .................................. 2014-118585

(51) Int. Cl.
    H03M 1/34      (2006.01)
    H04N 5/378     (2011.01)
    (Continued)

(52) U.S. Cl.
    CPC ............. *H04N 5/378* (2013.01); *H03M 1/08* (2013.01); *H03M 1/56* (2013.01); *H04N 5/363* (2013.01);
    (Continued)

(58) Field of Classification Search
    CPC .... H04N 5/378; H04N 5/374; H04N 5/37457; H04N 5/3742; H04N 5/335; H03M 1/56;
    (Continued)

(56) References Cited

U.S. PATENT DOCUMENTS 8,890,742 B2    11/2014   Chou et al.
2007/0008206 A1*  1/2007  Tooyama ............ H03M 1/0607
                                                         341/155
(Continued)

FOREIGN PATENT DOCUMENTS

CN    101141550 A    3/2008
CN    101969535 A    2/2011
(Continued)

OTHER PUBLICATIONS

International Search Report and Written Opinion of PCT Application No. PCT/JP2015/065191, dated Jun. 23, 2015, 06 pages of English Translation and 06 pages of ISRWO.
(Continued)

*Primary Examiner* — Linh Nguyen
(74) *Attorney, Agent, or Firm* — Wolf, Greenfield & Sacks, P.C.

(57) ABSTRACT

The present technology relates to an image sensor, an electronic apparatus, a comparator, and a drive method enabling achievement of a noise reduction while maintaining high speed of AD conversion. An ADC for performing AD conversion for an electrical signal output from a pixel includes a comparator that compares the electrical signal and a reference signal, a level of which is changed and a counter that counts time necessary for a change of the reference signal to a coincidence of the electrical signal and the reference signal on the basis of output signals from the comparator. The comparator includes a differential amplifier that outputs a comparison result signal indicating a comparison result obtained by comparing the electrical signal and the reference signal and a plurality of output amplifiers that outputs signals obtained by amplifying the comparison result signal output from the differential amplifier as the output signals at different timings.

24 Claims, 16 Drawing Sheets

(51) Int. Cl.
  *H03M 1/56* (2006.01)
  *H03M 1/08* (2006.01)
  *H04N 5/374* (2011.01)
  *H04N 5/3745* (2011.01)
  *H04N 5/363* (2011.01)
  *H04N 5/369* (2011.01)

(52) U.S. Cl.
  CPC ......... *H04N 5/374* (2013.01); *H04N 5/37455* (2013.01); *H04N 5/3698* (2013.01)

(58) Field of Classification Search
  CPC ...... H03M 1/123; H03M 1/0863; H03M 1/34; H03M 1/08; H03M 1/002; H03M 1/0872; H03M 1/1023; H03M 1/36; H03M 7/16
  USPC ...... 341/153, 163, 164; 348/221.1, 294–297, 348/302–308
  See application file for complete search history.

(56) References Cited

U.S. PATENT DOCUMENTS

| | | | |
|---|---|---|---|
| 2007/0030190 A1* | 2/2007 | Lee | H03M 1/002 341/155 |
| 2008/0094494 A1 | 4/2008 | Lee et al. | |
| 2009/0128676 A1* | 5/2009 | Tanaka | H04N 5/335 348/300 |
| 2009/0184236 A1* | 7/2009 | Kawaguchi | H04N 5/3742 250/208.1 |
| 2010/0002120 A1* | 1/2010 | Yoshikawa | H03K 5/2481 348/312 |
| 2011/0019047 A1 | 1/2011 | Suzuki et al. | |
| 2011/0074994 A1 | 3/2011 | Wakabayashi et al. | |
| 2012/0019697 A1 | 1/2012 | Suzuki | |
| 2012/0119063 A1* | 5/2012 | Takamiya | H04N 5/374 250/208.1 |
| 2012/0147233 A1 | 6/2012 | Sakai | |
| 2012/0188428 A1 | 7/2012 | Tanaka | |
| 2012/0307120 A1* | 12/2012 | Ito | H04N 5/341 348/302 |
| 2013/0147995 A1* | 6/2013 | Kim | H04N 5/335 348/300 |
| 2013/0293754 A1 | 11/2013 | Wakabayashi et al. | |
| 2014/0211055 A1 | 7/2014 | Wakabayashi et al. | |
| 2014/0293104 A1* | 10/2014 | Tanaka | H04N 5/3745 348/301 |
| 2014/0361916 A1 | 12/2014 | Wolfs | |

FOREIGN PATENT DOCUMENTS

| | | |
|---|---|---|
| CN | 102047563 A | 5/2011 |
| CN | 102348074 A | 2/2012 |
| EP | 2290823 A1 | 3/2011 |
| JP | 2008-067357 A | 3/2008 |
| JP | 2009-296423 A | 12/2009 |
| JP | 2011-050046 A | 3/2011 |
| KR | 10-2008-0022887 A | 3/2008 |
| KR | 10-2011-0014609 A | 2/2011 |
| TW | 201012075 A | 3/2010 |
| TW | 201212646 A | 3/2012 |
| WO | 2009/148107 A1 | 12/2009 |

OTHER PUBLICATIONS

International Preliminary Report on Patentability of PCT Application No. PCT/JP2015/065191, dated Dec. 22, 2016, 07 pages of English Translation and 03 pages of PRP.
Non-Final Rejection for U.S. Appl. No. 15/311,701, dated Apr. 16, 2018, 12 pages.
Advisory Action for U.S. Appl. No. 15/311,701, dated Jan. 24, 2018, 03 pages.
Final Rejection for U.S. Appl. No. 15/311,701, dated Nov. 6, 2017.
Non-Final Rejection for U.S. Appl. No. 15/311,701, dated May 31, 2018, 10 pages.

\* cited by examiner

IMAGE SENSOR, ELECTRONIC APPARATUS, COMPARATOR, AND DRIVE METHOD

CROSS-REFERENCE PARAGRAPH

The present application is a continuation application of U.S. patent application Ser. No. 15/311,701, filed Nov. 16, 2016, which is a national stage of PCT/JP2015/065191, filed May 27, 2015, and claims the benefit of priority from prior Japanese Patent Application JP 2014-118585, filed Jun. 9, 2014. Each of the above-referenced applications is hereby incorporated herein by reference in its entirety.

TECHNICAL FIELD

The present technology relates to an image sensor, an electronic apparatus, a comparator, and a drive method, and particularly to an image sensor, an electronic apparatus, a comparator, and a drive method that enable achievement of a noise reduction while maintaining high speed of AD conversion, for example.

BACKGROUND ART

In an image sensor, an electrical signal obtained by photoelectric conversion of a pixel is subjected to AD (Analog to Digital) conversion in an ADC (Analog to Digital Converter), and the AD conversion result is output as a pixel value.

As a method of reducing a noise included in the pixel value output from the image sensor as mentioned above, there is a method of obtaining a plurality of AD conversion results of the electrical signal output from the pixel and outputting an average value of the plurality of AD conversion results as a pixel value (see, for example, Patent Document 1).

Patent Document 1: Japanese Patent Application Laid-open No. 2009-296423

SUMMARY OF INVENTION

Problem to be Solved by the Invention

As a method of obtaining a plurality of AD conversion results of the electrical signal output from the pixel, there is a method of performing AD conversion a plurality of number of times in the ADC.

In the ADC, however, performing the AD conversion a plurality of number of times requires time therefor.

In view of this, a technology capable of achieving noise reduction of a pixel value while maintaining high speed of the AD conversion is demanded to be proposed.

The present technology has been made in view of the circumstances as described above and enables achievement of the noise reduction while maintaining the high speed of the AD conversion.

Means for Solving the Problem

According to the present technology, there is provided an image sensor including: a pixel that has a photoelectric conversion element for performing photoelectric conversion and outputs an electrical signal; a reference signal output unit that outputs a reference signal, a level of which is changed; and an ADC that performs AD (Analog Digital) conversion for the electrical signal by counting time necessary for a change of the reference signal to a coincidence of the electrical signal output from the pixel and the reference signal output from the reference signal output unit, in which the ADC includes a comparator that compares the electrical signal with the reference signal, and a counter that counts time necessary for a change of the reference signal to a coincidence of the electrical signal and the reference signal on the basis of output signals from the comparator, and the comparator includes a differential amplifier that outputs a comparison result signal indicating a comparison result obtained by comparing the electrical signal and the reference signal, and a plurality of output amplifiers that outputs, at different timings, signals obtained by amplifying the comparison result signal output from the differential amplifier as the output signals.

According to the present technology, there is provided a drive method, including: outputting, by a plurality of output amplifiers of an image sensor, signals obtained by amplifying a comparison result signal output from a differential amplifier as output signals at different timings. The image sensor includes a pixel that has a photoelectric conversion element for performing photoelectric conversion and outputs an electrical signal, a reference signal output unit that outputs a reference signal, a level of which is changed, and an ADC that performs AD (Analog Digital) conversion for the electrical signal by counting time necessary for a change of the reference signal to a coincidence of the electrical signal output from the pixel and the reference signal output from the reference signal output unit. The ADC includes a comparator that compares the electrical signal with the reference signal, and a counter that counts time necessary for a change of the reference signal to a coincidence of the electrical signal and the reference signal on the basis of the output signals from the comparator. The comparator includes the differential amplifier that outputs the comparison result signal indicating a comparison result obtained by comparing the electrical signal and the reference signal, and the plurality of output amplifiers that outputs signals obtained by amplifying the comparison result signal output from the differential amplifier as the output signals.

According to the present technology, there is provided an electronic apparatus, including: an optical system that collects light; and an image sensor that receives light and takes an image, in which the image sensor includes a pixel that has a photoelectric conversion element for performing photoelectric conversion and outputs an electrical signal, a reference signal output unit that outputs a reference signal, a level of which is changed, and an ADC that performs AD (Analog Digital) conversion for the electrical signal by counting time necessary for a change of the reference signal to a coincidence of the electrical signal output from the pixel and the reference signal output from the reference signal output unit. The ADC includes a comparator that compares the electrical signal with the reference signal, and a counter that counts time necessary for a change of the reference signal to a coincidence of the electrical signal and the reference signal on the basis of output signals from the comparator. The comparator includes a differential amplifier that outputs a comparison result signal indicating a comparison result obtained by comparing the electrical signal and the reference signal, and a plurality of output amplifiers that outputs, at different timings, signals obtained by amplifying the comparison result signal output from the differential amplifier as the output signals.

According to the present technology, there is provided a comparator, including: a differential amplifier that outputs a comparison result signal indicating a comparison result obtained by comparing two signals; and a plurality of output amplifiers that outputs signals obtained by amplifying the comparison result signal output from the differential amplifier at different timings.

In the present technology, in the differential amplifier, the comparison result signal that indicates the comparison result obtained by comparing two signals, for example, the comparison result obtained by comparing the electrical signal and the reference signal is output. Then, in the plurality of output amplifiers, the signals obtained by amplifying the comparison result signal output from the differential amplifier are output at the different timings.

It should be noted that the image sensor and the comparator may be apparatuses independent of each other or may be internal blocks that constitute one apparatus.

EFFECTS OF THE INVENTION

According to the present technology, it is possible to achieve the noise reduction while maintaining high speed of the AD conversion. It should be noted that, the effects described here are not necessarily limited, and any effect described in this disclosure may be obtained.

MODE (S) FOR CARRYING OUT THE INVENTION

<Embodiment of Digital Camera to Which Present Technology is Applied>

Figure 1:
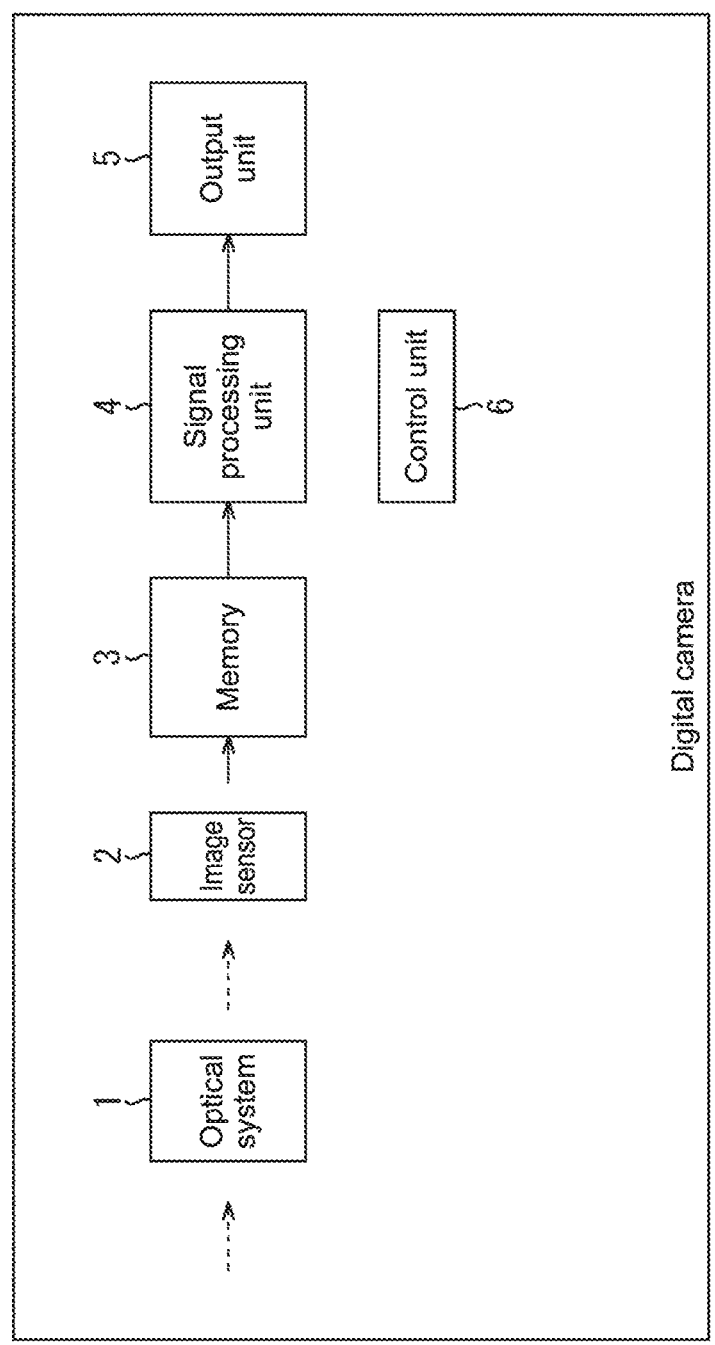
FIG. 1 A block diagram showing a configuration example of an embodiment of a digital camera to which the present technology is applied.

FIG. 1 is a block diagram showing a configuration example of an embodiment of a digital camera to which the present technology is applied. It should be noted that the digital camera can take still images and moving images. In FIG. 1, the digital camera includes an optical system 1, an image sensor 2, a memory 3, a signal processing unit 4, an output unit 5, and a control unit 6.

The optical system 1 has a zoom lens, a focus lens, an aperture, and the like (not shown) and causes light from outside to enter the image sensor 2.

The image sensor 2 is, for example, a CMOS (Complementary Metal Oxide Semiconductor) image sensor. The image sensor 2 receives incident light from the optical system 1, performs photoelectric conversion, and output image data corresponding to the incident light from the optical system 1.

The memory 3 temporarily stores the image data output from the image sensor 2.

The signal processing unit 4 performs processing such as noise removal and white balance adjustment, as signal processing using the image data stored in the memory 3, and outputs the data to the output unit 5.

The output unit 5 outputs the image data from the signal processing unit 4. That is, the output unit 5 has, for example, a display (not shown) configured by liquid crystal or the like and displays an image corresponding to the image data from the signal processing unit 4 as so-called a through image.

Further, for example, the output unit 5 has a driver (not shown) for driving a recording medium such as a semiconductor memory, a magnetic disk, an optical disc, and the like, and records the image data from the signal processing unit 4. The control unit 6 controls blocks that constitute the digital camera on the basis of an operation or the like by a user.

In the digital camera configured as described above, the image sensor 2 receives the incident light from the optical system 1 and outputs the image data in accordance with the incident light.

The image data that is output from the image sensor 2 is supplied to the memory 3 and stored therein. The image data stored in the memory 3 is subjected to the signal processing by the signal processing unit 4, and the image data thus obtained is supplied and output to the output unit 5.

<Configuration Example of Image Sensor 2>

Figure 2:
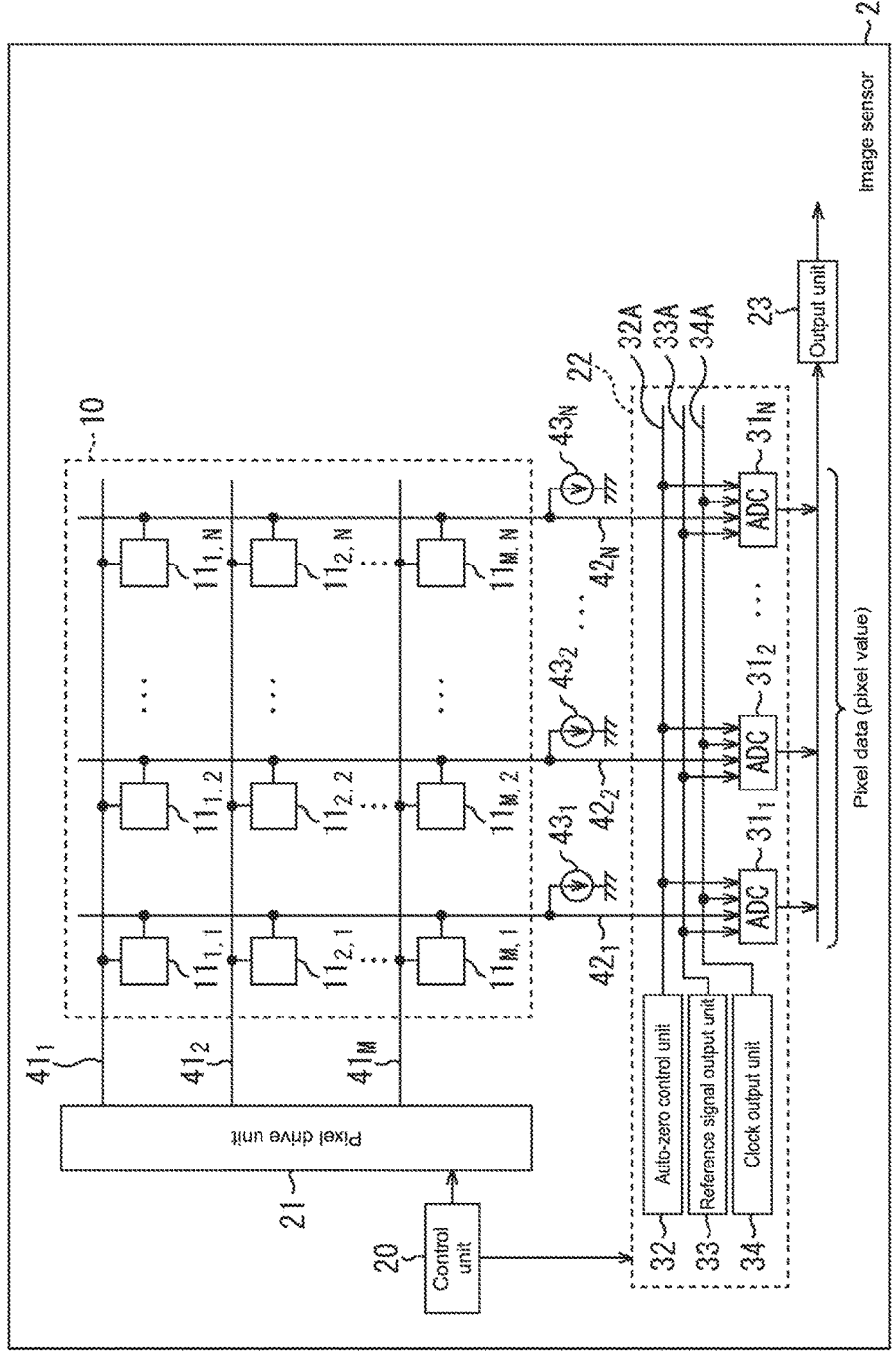
FIG. 2 A block diagram showing a configuration example of an image sensor 2.

FIG. 2 is a block diagram showing a configuration example of the image sensor 2 shown in FIG. 1.

In FIG. 2, the image sensor 2 includes a pixel array 10, a control unit 20, a pixel drive unit 21, a column-parallel AD conversion unit 22, and an output unit 23.

The pixel array 10 has M*N (M and N are integers equal to or greater than 1) pixels $11_{1,1}, 11_{1,2}, \ldots, 11_{1,N}, 11_{2,1}, 11_{2,2}, \ldots, 11_{2,N}, \ldots, 11_{M,1}, 11_{M,2}, \ldots, 11_{M,N}$ that perform photoelectric conversion, and functions as an image pickup unit (image pickup element) that takes an image.

The M*N pixels $11_{1,1}$ to $11_{M,N}$ are arranged on a two-dimensional plane in a matrix (lattice) pattern of M rows and N columns.

In the pixel array 10, to N pixels $11_{m,1}$ to $11_{m,N}$ on the m-th row (m=1, 2, . . . , M) (from the top), which are arranged in a row direction (horizontal direction), a pixel control line $41_m$ that extends in the row direction is connected.

Further, to M pixels $11_{1,n}$ to $11_{M,n}$ on the n-th column (n=1, 2, . . . , N) (from the left), which are arranged in a column direction (vertical direction), a VSL (Vertical Signal Line) $42_n$ that extends in the column direction is connected.

The pixel $11_{m,n}$ performs photoelectric conversion for light (incident light) that is incident thereon. Further, the pixel $11_{m,n}$ outputs a voltage (electrical signal) corresponding to charges obtained by the photoelectric conversion to the VSL $42_n$ to which a current source $43_n$ is connected in accordance with the control from the pixel drive unit 21 through the pixel control line $41_m$.

It should be noted that, for example, the pixel $11_{m,n}$ can perform the photoelectric conversion for light of a predetermined color which is incident through color filters (not shown) in a Bayer arrangement or the like.

The control unit 20 controls the pixel drive unit 21, the column-parallel AD conversion unit 22 (constituted of an auto-zero control unit 32, a reference signal output unit 33, and the like), and other necessary blocks in accordance with a predetermined logic or the like.

On the basis of the control by the control unit 20, the pixel drive unit 21 controls (drives) the pixels $11_{m,1}$ to $11_{m,N}$ connected to the pixel control line $41_m$ through the pixel control line $41_m$.

The column-parallel AD conversion unit 22 is connected with each of the pixels $11_{m,1}$ to $11_{m,N}$ arranged in a row through the VSL $42_1$ to $42_N$, and therefore an electrical signal (voltage) (hereinafter, also referred to as VSL signal) output from the pixel $11_{m,n}$ onto the VSL $42_n$ is supplied to the column-parallel AD conversion unit 22.

The column-parallel AD conversion unit 22 performs the AD conversion in parallel for the VSL signal supplied from the pixels $11_{m,1}$ to $11_{m,N}$ arranged in a row through the VSL $42_1$ to $42_N$, and supplies digital data thus obtained to the output unit 23 as pixel values (pixel data) of the pixels $11_{m,1}$ to $11_{m,N}$.

Here, the column-parallel AD conversion unit 22 can perform the AD conversion in parallel for all electrical signals of the N pixels $11_{m,1}$ to $11_{m,N}$ arranged in a row and can perform parallel AD conversion for electrical signals of one or more and less than N pixels out of the N pixels $11_{m,1}$ to $11_{m,N}$.

However, in the following description, to make explanation simple, the assumption is made that the column-parallel AD conversion unit 22 performs parallel AD conversion for the VSL signals of all the N pixels $11_{m,1}$ to $11_{m,N}$ arranged in a row.

To perform the parallel AD conversion for the VSL signals of all the N pixels $11_{m,1}$ to $11_{m,N}$ arranged in a row, the column-parallel AD conversion unit 22 includes N ADCs (Analog to Digital Converters) $31_1$ to $31_N$.

Further, the column-parallel AD conversion unit 22 includes the auto-zero control unit 32, the reference signal output unit 33, and a clock output unit 34.

The auto-zero control unit 32 supplies (outputs) an auto-zero pulse, which is a signal for controlling auto-zero processing of a comparator $61_n$ (to be described later) held by the ADC $31_n$, to the ADC $31_1$ to $31_N$ via an auto-zero control line 32A.

The reference signal output unit 33 is configured by a DA (Digital to Analog) converter, for example, and supplies (outputs) a reference signal having a period in which a level (voltage) changes from a predetermined initial value to a predetermined final value at a certain inclination as a ramp signal to the ADC $31_1$ to $31_N$ via a reference signal line 33A.

The clock output unit 34 supplies (outputs) a clock of a predetermined frequency to the ADC $31_1$ to $31_N$ via a clock line 34A. The ADC $31_n$ is connected to a VSL $41_n$. Therefore, to the ADC $31_n$, the VSL signal (electrical signal) output onto the VSL $41_n$ by the pixel $11_{m,n}$ is supplied.

The ADC $31_n$ performs the AD conversion for the VSL signal output from the pixel $11_{m,n}$ with the use of the reference signal from the reference signal output unit 33 and the clock from the clock output unit 34, and determines digital data as a pixel value by performing CDS (Correlated Double Sampling).

Here, the ADC $31_n$ compares the VSL signal of the pixel $11_{m,n}$ with the reference signal from the reference signal output unit 33, and counts time necessary for a change in level of the reference signal until the levels of the VSL signal of the pixel $11_{m,n}$ and the reference signal coincide (magnitude relationship between the VSL signal and the reference signal is reversed), thereby performing the AD conversion for the VSL signal of the pixel $11_{m,n}$.

In the ADC 31 n, counting time necessary for a change in level of the reference signal until the levels of the VSL signal of the pixel $11_{m,n}$ and the reference signal coincide is performed by counting a clock from the clock output unit 34.

Further, to the N ADCs $31_1$ to $31_N$, the VSL signals of the N pixels $11_{m,1}$ to $11_{m,N}$ from the first row to the M-th row of the pixel array 10 are sequentially supplied, for example, from the first row, and the AD conversion of the VSL signal and the CDS are performed in unit of row.

The output unit 23 selects a column n from which a pixel value is read, and from the ADC $31_n$ in the column n, reads a result of the AD conversion (and the CDS) of the pixel $11_{m,n}$ obtained in the ADC $31_n$ as a pixel value, and outputs to the outside (in this embodiment, the memory 3 (FIG. 1)).

It should be noted that, in this case, in the ADC $31_n$, in addition to the AD conversion, the CDS is also performed. Alternatively, only the AD conversion is performed in the ADC $31_n$, and the CDS can be performed in the output unit 23.

Further, in the following description, explanation on the CDS will be omitted as appropriate.

<Configuration Example of pixel $11_{m,n}$>

Figure 3:
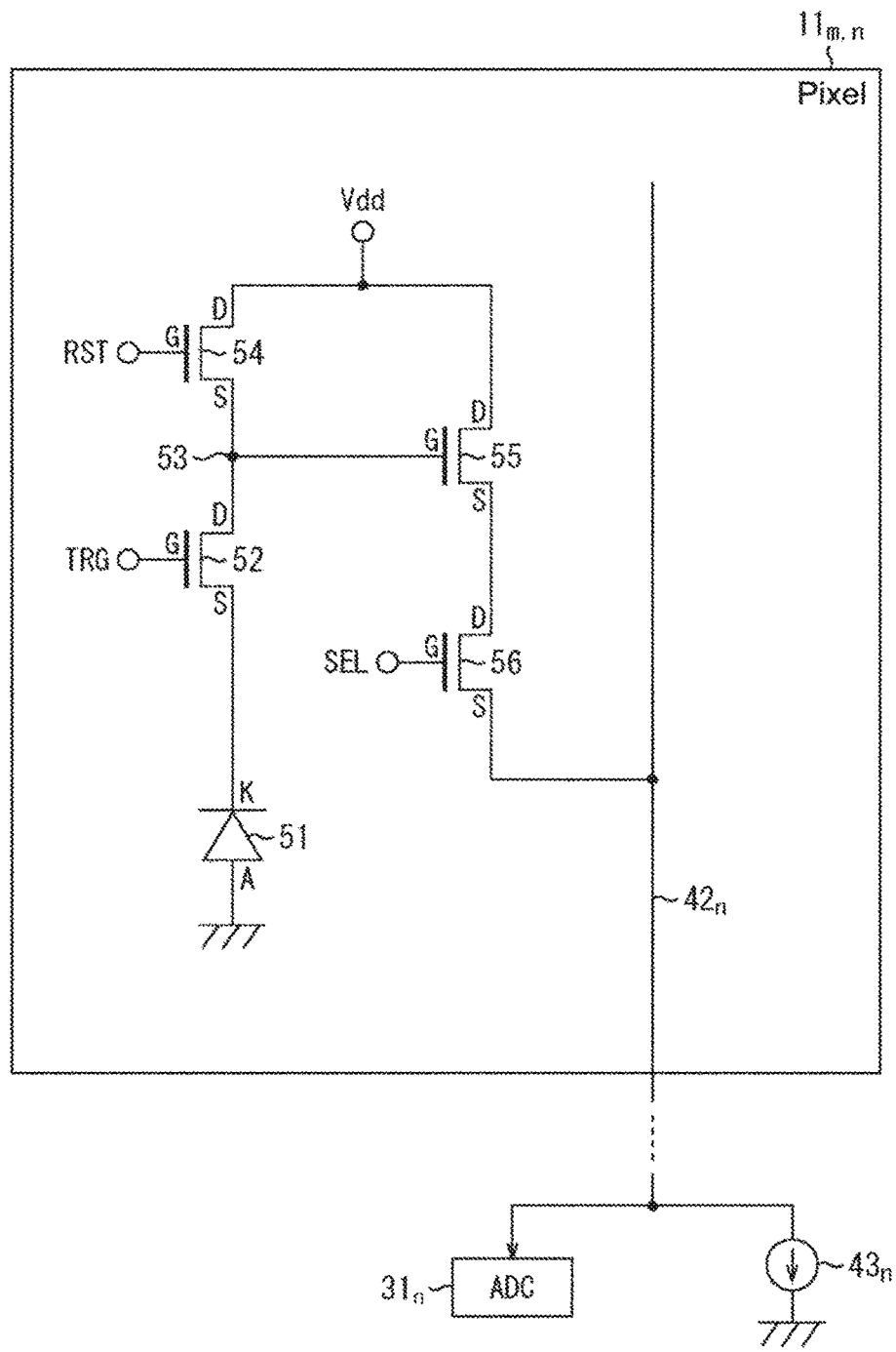
FIG. 3 A circuit diagram showing a configuration example of a pixel $11_{m,n}$.

FIG. 3 is a circuit diagram showing a configuration example of the pixel $11_{m,n}$ shown in FIG. 2.

In FIG. 3, the pixel $11_{m,n}$ includes a PD 51 and four NMOS (negative channel MOS) FETs (Field Effect Transistors) 52, 54, 55, and 56.

Further, in the pixel $11_{m,n}$, a drain of the FET 52, a source of the FET 54, and a gate of the FET 55 are connected. On connection points thereof, an FD (Floating Diffusion) (capacitance) 53 for converting a charge into a voltage is formed.

The PD 51 is an example of a photoelectric conversion element that performs photoelectric conversion. The PD 51 receives incident light and accumulates charges corresponding to the incident light, thereby performing photoelectric conversion.

An anode of the PD 51 is connected to ground (grounded), and a cathode of the PD 51 is connected to the source of the FET 52.

The FET 52 is an FET for transferring the charges accumulated in the PD 51 from the PD 51 to the FD 53, and is therefore also referred to as a transfer Tr 52, hereinafter.

A source of the transfer Tr 52 is connected to the cathode of the PD 51, and the drain of the transfer Tr 52 is connected to the source of the FET 54 through the FD 53.

Further, a gate of the transfer Tr 52 is connected to the pixel control line $41_m$, and to the gate of the transfer Tr 52, through the pixel control line $41_m$, a transfer pulse TRG is supplied.

Here, in order that the pixel drive unit 21 (FIG. 2) drives (controls) the pixel $11_{m,n}$ via the pixel control line $41_m$, the control signals supplied through the pixel control line $41_m$ include a reset pulse RST, and a selection pulse SEL to be described later in addition to the transfer pulse TRG.

The FD 53 is a region that is formed at a connection point of the drain of the transfer Tr 52, the source of the FET 54, and the gate of the FET 55 and converts a charge into a voltage like a capacitor.

The FET 54 is an FET for resetting the charges (voltage (potential)) accumulated in the FD 53, and is also referred to as a reset Tr 54 hereinafter.

A drain of the reset Tr 54 is connected to a power supply Vdd.

Further, a gate of the reset Tr 54 is connected to the pixel control line $41_m$, and to the gate of the reset Tr 54, through the pixel control line $41m$, the reset pulse RST is supplied.

The FET 55 is an FET for buffering the voltage of the FD 53 and is also referred to as an amplification Tr 55.

The gate of the amplification Tr 55 is connected to the FD 53, and a drain of the amplification Tr 55 is connected to the power supply Vdd. Further, a source of the amplification Tr 55 is connected to a drain of the FET 56.

The FET 56 is an FET for selecting an output of the electrical signal (VSL signal) to the VSL $42_n$ and is also referred to as a selection Tr 56, hereinafter.

A source of the selection Tr 56 is connected to the VSL $42_n$.

Further, a gate of the selection Tr 56 is connected to the pixel control line $41_m$, and to the gate of the selection Tr 56, through the pixel control line $41_m$, the selection pulse SEL is supplied.

Here, the source of the amplification Tr 55 is connected to the selection Tr 56 and to the current source $43_n$ through the VSL $42_n$, with the result that the amplification Tr 55 and the current source $43_n$ constitute an SF (Source Follower) (circuit), and thus, the FD 53 is connected to the VSL $42_n$ through the SF.

It should be noted that the pixel $11_{m,n}$ can be configured without the selection Tr 56.

Further, as the configuration of the pixel $11_{m,n}$, it is possible to adopt the configuration of a shared pixel in which the FD 53 to the selection Tr 56 are shared by a plurality of PDs 51 and the transfer Tr 52.

In the pixel $11_{m,n}$ configured as described above, the PD 51 receives light incident thereon and performs the photoelectric conversion, thereby starting the accumulation of charges corresponding to the amount of the received incident light. It should be noted that, here, to make explanation simple, when the assumption is made that the selection pulse SEL is set to an H level, the selection Tr 56 is in an on state.

When a predetermined time (exposure time) elapses after the accumulation of the charges is started in the PD 51, the pixel drive unit 21 (FIG. 2) temporarily sets the transfer pulse TRG (from L (Low) level) to the H (High) level.

When the transfer pulse TRG is set to the H level temporarily, the transfer Tr 52 is temporarily brought into an on state.

When the transfer Tr 52 is in the on state, the charges accumulated in the PD 51 are transferred to and accumulated in the FD 53 through the transfer Tr 52.

The pixel drive unit 21 temporarily sets the reset pulse RST to the H level before temporarily setting the transfer pulse TRG to the H level, thereby temporarily setting the reset Tr 54 to the on state.

When the reset Tr 54 is in the on state, the FD 53 is connected to the power supply Vdd through the reset Tr 54, and the charges in the FD 53 are discharged to the power supply Vdd through the reset Tr 54 and reset.

Here, as described above, resetting the charges in the FD 53 with the FD 53 connected to the power supply Vdd means resetting the pixel $11_{m,n}$.

After the charges in the FD 53 are reset, as described above, the pixel drive unit 21 temporarily sets the transfer pulse TRG to the H level. As a result, the transfer Tr 52 is temporarily in the on state.

When the transfer Tr 52 is in the on state, the charges accumulated in the PD 51 are transferred, through the transfer Tr 52, to the FD 53 after the reset, and accumulated.

The voltage (potential) corresponding to the charges accumulated in the FD 53 is output as the VSL signal onto the VSL $42_n$ through the amplification Tr 55 and the selection Tr 56.

In the ADC $31_n$ (FIG. 2) connected to the VSL $42_n$, a reset level as the VSL signal immediately after the pixel $11_{m,n}$ is reset is subjected to the AD conversion.

Further, in the ADC $31_n$, a signal level (including reset level and level as pixel value), which is the VSL signal (voltage corresponding to the charges accumulated in the PD 51 and transferred to the FD 53) after the transfer Tr 52 is temporarily in the on state is subjected to the AD conversion.

Then, in the ADC $31_n$, CDS is carried out in which a difference between the result of the AD conversion of the reset level (hereinafter, also referred to as reset level AD value) and the result of the AD conversion of the signal level (hereinafter, also referred to as signal level AD value) is determined as a pixel value.

<First Configuration Example of ADC $31_n$>

Figure 4:
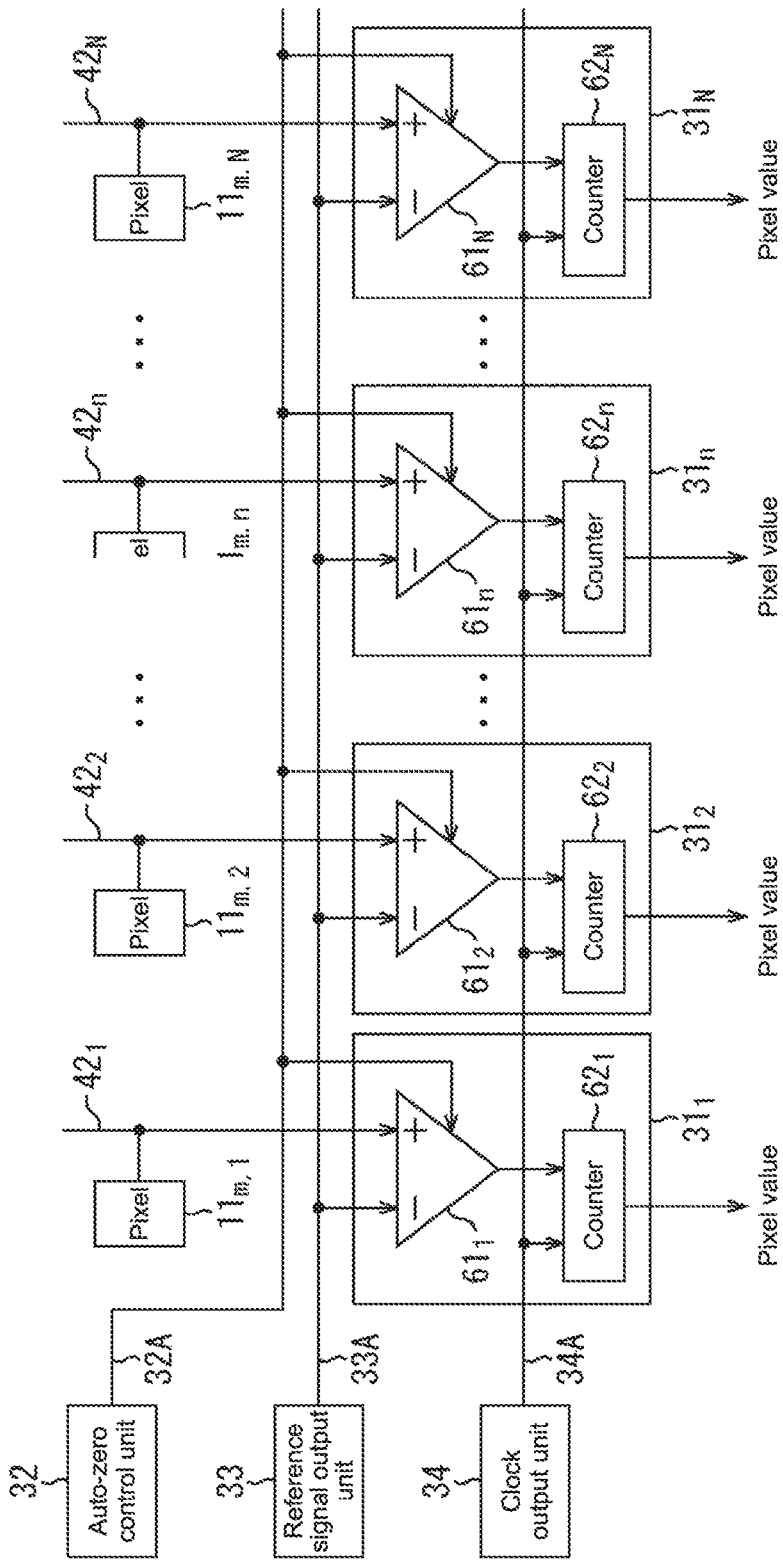
FIG. 4 A block diagram showing a first configuration example of an ADC $31_n$.

FIG. 4 is a block diagram showing a first configuration example of the ADC $31_n$ shown in FIG. 2.

The ADC $31_n$ includes the comparator $61_n$ and a counter $62_n$, and performs the CDS and the AD conversion of reference signal comparison type.

The comparator $61_n$ has two input terminals of an inverting input terminal (−) and a non-inverting input terminal (+).

To the inverting input terminal (−) as one of the two input terminals of the comparator $61_n$, the reference signal from the reference signal output unit 33 and, for example, the reference signal as one of the VSL signals (reset level and signal level) of the pixel $11_{m,n}$ are supplied. To the non-inverting input terminal (+) as the other of the input terminals of the comparator $61_n$, the reference signal from the reference signal output unit 33 and, for example, the VSL signal as the other of the VSL signals of the pixel $11_{m,n}$ are supplied.

The comparator $61_n$ compares the reference signal supplied to the inverting input terminal with the VSL signal supplied to the non-inverting input terminal, and outputs a result of the comparison.

That is, in the case where the reference signal supplied to the inverting input terminal is larger than the VSL signal supplied to the non-inverting input terminal, the comparator $61_n$ outputs, for example, an L level as one of the H and L levels.

Further, in the case where the VSL signal supplied to the non-inverting input terminal has a voltage larger than the reference signal supplied to the inverting input terminal, the comparator $61_n$ outputs the H level as the other of the H and L levels.

It should be noted that, to the comparator $61_n$, from the auto-zero control unit 32, an auto-zero pulse is supplied through the auto-zero control line 32A. In the comparator $61_n$, in accordance with the auto-zero pulse from the auto-zero control unit 32, auto-zero processing is performed.

Here, in the auto-zero processing, the comparator $61_n$ is set so as to obtain a comparison result that the two input signals actually given to the comparator $61_n$, that is, the signal actually supplied to the inverting input terminal of the comparator $61_n$ and the signal actually supplied to the non-inverting input terminal coincide in the comparator $61_n$.

To the counter $62n$, an output of the comparator $61n$ and a clock from the clock output unit 34 are supplied.

The counter $62n$ starts counting of the clock from the clock output unit 34 at timing when the (level of) reference signal supplied from the reference signal output unit 33 to the comparator $61_n$ starts to change, for example. During when the output from the comparator $61_n$ is at the L level, for example, the counter $62_n$ continues to count the clock. Then, when the output from the comparator $61n$ is changed from the L level to the H level, for example, that is, when the levels of the reference signal supplied to the inverting input terminal of the comparator $61_n$ and the VSL signal supplied to the non-inverting input terminal become equal to each other (when the magnitude relationship between the reference signal and the VSL signal is reversed), the counter $62_n$ terminates the counting of the clock from the clock output unit 34.

Then, the counter $62n$ outputs the count value of the clock as the AD conversion result of the VSL signal supplied to the non-inverting input terminal of the comparator $61n$.

Here, the reference signal output unit 33 outputs, as the reference signal, for example, a signal having such a slope (slope-like waveform) that a voltage is reduced at a constant rate from a predetermined initial value to a predetermined final value.

In this case, in the counter $62_n$, time from the start of the slope to a change of the reference signal to a voltage that coincides with the VSL signal supplied to the non-inverting input terminal of the comparator $61_n$ is counted. A count value thus obtained is the AD conversion result of the VSL signal supplied to the non-inverting input terminal of the comparator $61_n$.

The ADC $31n$ obtains, from the pixel $11_{m,n}$, the AD conversion result of a reset level as the VSL signal supplied to the non-inverting input terminal of the comparator $61_n$ and a signal level. Then, the ADC $31_n$ performs CDS for obtaining a difference between the AD conversion result of the signal level (signal level AD value) and the AD conversion result of the reset level (reset level AD value) and outputs the difference obtained by the CDS as the pixel value of the pixel $11_{m,n}$.

It should be noted that, in the ADC $31_n$, the CDS can be performed by actually carrying out calculation to obtain the difference between the signal level AD value and the reset level AD value and can be performed by controlling counting the clock in the counter $62_n$, for example.

That is, in the counter $62_n$, for the reset level, for example, the clock is counted by decrementing the count value by 1, and for the signal level, the clock is counted by incrementing the count value by 1 with the count value of the clock for the reset level as the initial value. As a result, it is possible to perform the CDS to obtain the difference between the (AD conversion result of) signal level and the (AD conversion result of) of the reset level while performing the AD conversion of the reset level and the signal level.

Further, in this embodiment, as the reference signal, the ramp signal having the slope reduced at the constant rate is adopted. In addition, as the reference signal, a ramp signal or the like having a slope increased at a constant rate can be adopted, for example.

<Configuration Example of Comparator $61_n$>

Figure 5:
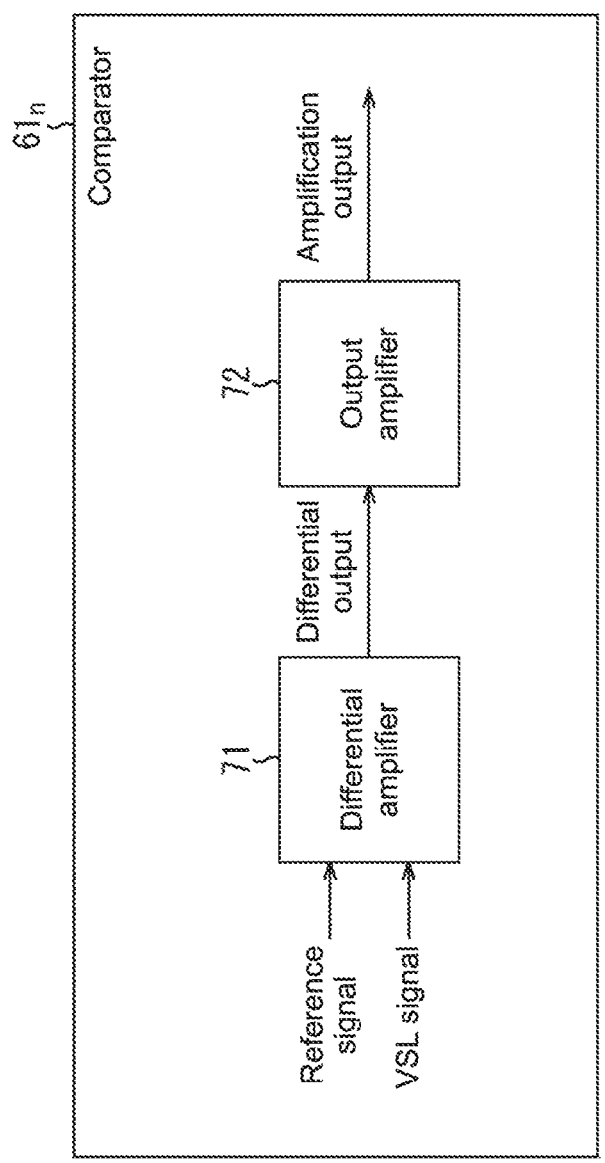
FIG. 5 A block diagram showing a configuration example of a comparator $61_n$.

FIG. 5 is a block diagram showing a configuration example of the comparator $61_n$ shown in FIG. 4.

The comparator 61 n includes a differential amplifier 71 and an output amplifier 72.

To the differential amplifier 71, the reference signal and the VSL signal are supplied.

The differential amplifier 71 outputs a comparison result signal, which indicates a comparison result obtained by comparing the two signals of the reference signal and the VSL signal supplied thereto, to the output amplifier 72 as a differential output. That is, the differential amplifier 71 outputs a signal corresponding to the difference between the reference signal and the VSL signal as the differential output.

The output amplifier 72 functions as a buffer for buffering the differential output in order to output the differential output (comparison result signal) output from the differential amplifier 71 to a subsequent circuit at an appropriate level.

That is, the output amplifier 72 amplifies the differential output (comparison result signal) output from the differential amplifier 71 by a predetermined gain, and outputs a signal obtained by the amplification as an amplification output.

The amplification output by the output amplifier 72 is supplied to the counter $62_n$ as a final output signal of the comparator $61_n$, which indicates a comparison result obtained by comparing the reference signal and the VSL signal.

As described above, the counter $62_n$ counts the clock from the clock output unit 34 and terminates counting of the clock in accordance with the output of the comparator $61_n$. Then, the counter $62_n$ outputs the count value of the clock as the AD conversion result of the VSL signal supplied to the (differential amplifier 71 of) comparator $61_n$.

<Configuration Example of Differential Amplifier 71 and Output Amplifier 72>

Figure 6:
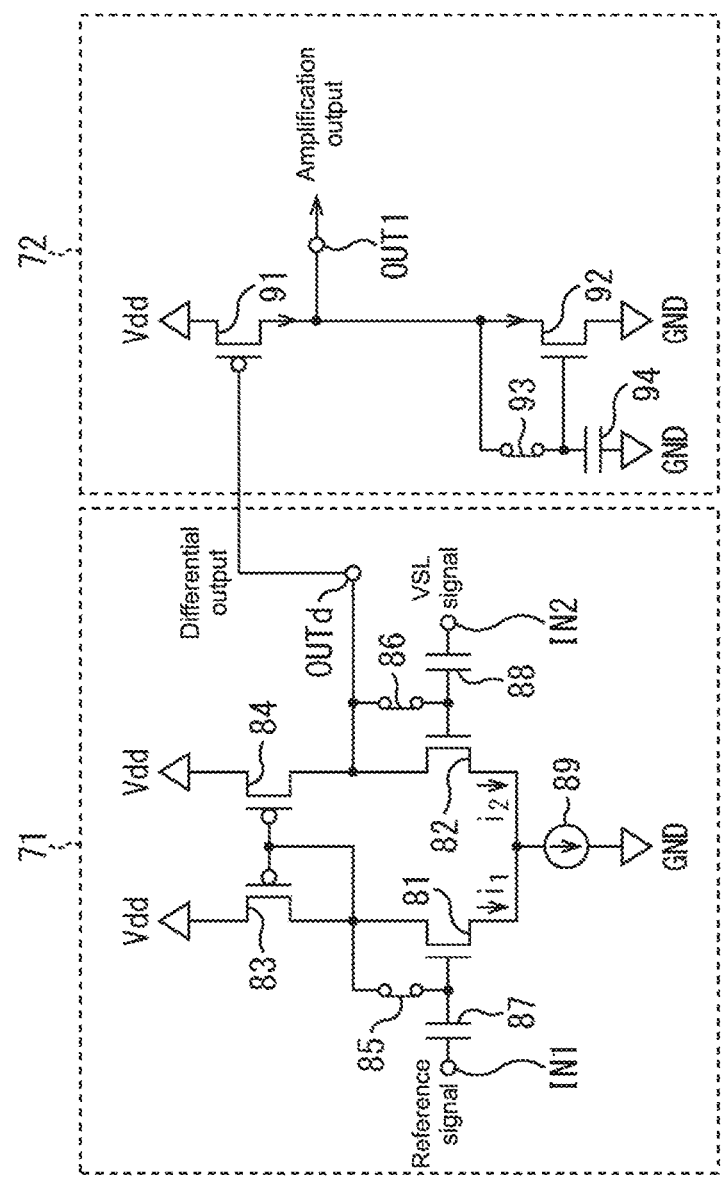
FIG. 6 A circuit diagram showing a configuration example of a differential amplifier 71 and an output amplifier 72.

FIG. 6 is a circuit diagram showing a configuration example of the differential amplifier 71 and the output amplifier 72 shown in FIG. 5.

In FIG. 6, the differential amplifier 71 includes FETs 81, 82, 83, and 84, switches 85 and 86, capacitors 87 and 88, and a current source 89. The FET 81 and FET 82 are NMOS (Negative Channel MOS) FETs, and sources thereof are connected with each other. Further, a connection point of the sources of the FET 81 and FET 82 is connected to one end of the current source 89, the other end of which is grounded. The FET 81 and FET 82 constitute so-called a differential pair.

A gate of the FET 81 is connected, through the capacitor 87, to the inverting input terminal IN1 of the comparator $61_n$ (differential amplifier 71), and a gate of the FET 82 is connected, through the capacitor 88, to the non-inverting input terminal IN2 of the comparator $61_n$ (differential amplifier 71).

As described above, the comparator $61_n$ has the differential pair constituted of the FET 81 and the FET 82 in an input stage.

The FET 83 and the FET 84 are PMOS (Positive Channel MOS) FETs, and gates thereof are connected with each other.

Further, sources of the FET 83 and the FET 84 are connected to the power supply Vdd, and a connection point of the gates of the FET 83 and the FET 84 are connected to a drain of the FET 83. Thus, the FET 83 and the FET 84 constitute a current mirror current mirror.

Out of the FET 83 and the FET 84 that constitute the current mirror, the drain of the FET 83 is connected to a drain of FET 81, and a drain of the FET 84 is connected to a drain of the FET 82.

Then, a connection point of the drains of the FET 82 and the FET 84 is connected to an output terminal OUTd of the differential amplifier 71.

The switch 85 and the switch 86 are, for example, switches configured by FETs or the like, and are turned on and off on the basis of the auto-zero pulse supplied from the auto-zero control unit 32.

That is, on the basis of the auto-zero pulse, the switch 85 is turned on or off so as to connect or disconnect the gate and the drain of the FET 81. On the basis of the auto-zero pulse, the switch 86 is turned on or off so as to connect or disconnect the gate and the drain of the FET 82.

One end of the capacitor 87 is connected to a gate of the FET 81, and the other end of the capacitor 87 is connected to the inverting input terminal IN1. One end of the capacitor 88 is connected to a gate of the FET 82, and the other end of the capacitor 88 is connected to the non-inverting input terminal IN2.

In FIG. 6, the output amplifier 72 includes FETs 91 and 92, a switch 93, and a capacitor 94.

The FET 91 is a PMOS FET, and a gate thereof is connected to the output terminal OUTd of the differential amplifier 71. A source of the FET 91 is connected to the power supply Vdd, and a drain thereof is connected to a drain of the FET 92.

The FET 92 is an NMOS FET and functions as the current source. A gate of the FET 92 is connected to one end of the capacitor 94, and a source thereof is grounded.

The switch 93 is, for example, a switch configured by an FET or the like, and is turned on or off on the basis of the auto-zero pulse supplied from the auto-zero control unit 32.

That is, the switch 93 is turned on or off so as to connect or disconnect the gate and the drain of the FET 92 on the basis of the auto-zero pulse. One end of the capacitor 94 is connected to the gate of the FET 92, and the other end thereof is grounded.

It should be noted that a connection point of the drain of the FET 91 and the drain of the FET 92 is connected to the output terminal OUT1 of the output amplifier 72, a voltage of the drain of the FET 91 and the drain of the FET 92 is output from the output terminal OUT1 as an amplification output.

In the comparator 61$_n$ configured as described above, to (the source from the drain of) the FET 81 of the differential amplifier 71, a current ii corresponding to a gate voltage of the FET 81 is flown, and to (the source from the drain of) the FET 82, a current i2 corresponding to a gate voltage of the FET 82 is flown.

Further, to (the drain from the source of) the FET 83 and the FET 84 that constitute the current mirror, the same current as the current ii that is flown to the FET 81 is flown.

In the case where a voltage (gate voltage of the FET 81) applied to the gate of the FET 81 from the inverting input terminal IN1 through the capacitor 87 is larger than a voltage (gate voltage of the FET 82) applied to the gate of the FET 82 from the non-inverting input terminal IN2 through the capacitor 88, the current $i_1$ that is flown to the FET 81 becomes larger than the current $i_2$ that is flown to the FET 82.

In this case, to the FET 84, the same current as the current $i_1$ that is flown to the FET 81 is flown. The current $i_2$ that is flown to the FET 82 connected to the FET 84 is smaller than the current $i_1$, so in the FET 82, a source-drain voltage becomes larger to increase the current $i_2$.

As a result, the differential output of the output terminal OUTd, which is the connection point of the FETs 82 and 84 becomes the H level.

On the other hand, in the case where the gate voltage of the FET 82 is larger than the gate voltage of the FET 81, the current $i_2$ that is flown to the FET 82 becomes larger than the current $i_1$ that is flown to the FET 81.

In this case, to the FET 84, the same current as the current $i_1$ flown to the FET 81 is flown. The current $i_2$ flown to the FET 82 connected to the FET 84 is larger than the current $i_1$, so in the FET 82, a drain-source voltage becomes smaller to decrease the current $i_2$.

As a result, the differential output of the output terminal OUTd, which is a connection point of the FETs 82 and 84 becomes the L level.

The differential output of the output terminal OUTd is supplied to the gate of FET 91 of the output amplifier 72.

In the output amplifier 72, the FET 92 functions as the current source, and in the case where the differential output supplied to the gate of the FET 91 is the H level, the FET 91 is off.

In the case where the FET 91 is off, the drain of the FET 91 is the L level, and thus the amplification output of the output terminal OUT1 is the L level.

On the other hand, in the case where the differential output supplied to the gate of the FET 91 is the L level, the FET 91 is on.

In the case where the FET 91 is on, the drain of the FET 91 is the H level, and thus the amplification output of the output terminal OUT1 is the H level.

Consequently, in the case where the reference signal supplied to the inverting input terminal IN1 has a higher voltage than the VSL signal supplied to the non-inverting input terminal IN2, the amplification output of the output terminal OUT1, that is, the output of the comparator 61$_n$ is the L level.

On the other hand, in the case where the VSL signal supplied to the non-inverting input terminal IN2 has a higher voltage than the reference signal supplied to the inverting input terminal IN1, the amplification output of the output terminal OUT1 (output of the comparator 61$_n$) is the H level.

Here, the switches 85, 86, and 93 are turned on or off on the basis of the auto-zero pulse.

The auto-zero pulse is, for example, a pulse that is turned from the L level into the H level temporarily, and the switches 85 and 86 become the off state when the auto-zero pulse is the L level, and become the on state when the auto-zero pulse is the H level.

When the switches 85 and 86 are brought into the on state, the gate and the drain of the FET 81 are connected, and the gate and the drain of the FET 82 are connected. The gate voltages of the FETs 81 and 82 become equal to each other.

Thus, when the auto-zero pulse becomes the H level, charges are accumulated in the capacitors 87 and 88 in such a manner that the voltage (gate voltage of the FET 81) applied to the gate of the FET 81 from the inverting input terminal IN1 through the capacitor 87 and the voltage (gate voltage of the FET 82) applied to the gate of the FET 82 from the non-inverting input terminal IN2 through the capacitor 88 are coincided.

Then, when the auto-zero pulse becomes the L level, the gate and the drain of the FET 81 are disconnected, and the gate and the drain of the FET 82 are disconnected. Further, in the capacitors 87 and 88, the charges accumulated when the auto-zero pulse is the H level are maintained.

As a result, the (differential amplifier 71 of) comparator 61$_n$ is set so as to obtain a comparison result indicating that the two input signals given to the comparator 61$_n$ when the auto-zero pulse is the H level (when the auto-zero pulse falls), that is, the reference signal supplied to the inverting input terminal IN1 of the comparator 61$_n$ and the VSL signal supplied to the non-inverting input terminal IN2 are coincided.

Performing the setting of the comparator 61$_n$ as described above is the auto-zero processing.

By the auto-zero processing, in the differential amplifier 71 and further in the comparator 61$_n$, it is possible to determine a magnitude relationship between the voltage given to the inverting input terminal IN1 and the voltage given to the non-inverting input terminal IN2, with the fact that the voltage given to the inverting input terminal IN1 of the comparator 61$_n$ and the voltage given to the non-inverting input terminal IN2 are coincided as a reference at the time of the auto-zero processing.

It should be noted that, in the output amplifier 72, like the switches 85 and 86, the switch 93 is in the off state when the auto-zero pulse is the L level, and is in the on state when the auto-zero pulse is the H level.

When the switch 93 is in the on state, the capacitor 94 is charged to have a voltage equal to the drain voltage of the FET 92. After that, when the switch 93 is in the off state, the voltage of the capacitor 94 is applied to the gate of the FET 92, and the FET 92 functions as a current source that causes the same current as the current that is flown when the switch 93 is in the on state to flow.

<Operation of Image Sensor 2>

Figure 7:
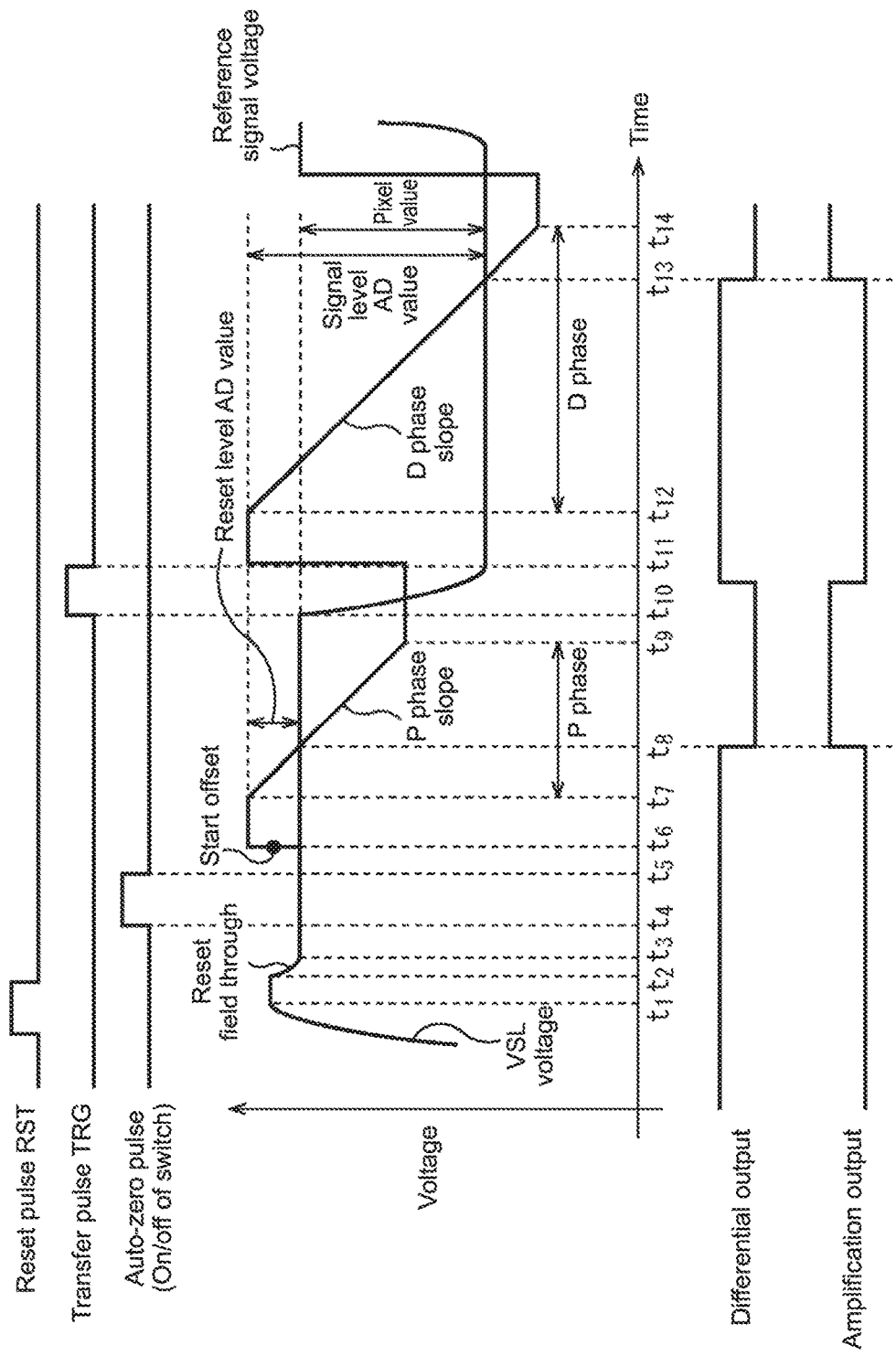
FIG. 7 A waveform diagram showing an example of a signal line voltage and a reference signal.

FIG. 7 is a diagram showing an operation of the image sensor 2 (FIG. 2). It should be noted that, in FIG. 7, the horizontal axis represents time, and the vertical axis represents voltage.

FIG. 7 is a waveform diagram showing examples of the (voltage of) VSL signal, which is an electrical signal supplied to the non-inverting input terminal IN2 (+) of the comparator 61$_n$ of the ADC 31 n from the pixel 11$_{m,n}$ through the VSL 42$_n$, and the (voltage of) reference signal supplied to the inverting input terminal IN1 (−) of the comparator 61$_n$ of the ADC 31$_n$ from the reference signal output unit 32 through the reference signal line 33A in the image sensor 2.

It should be noted that FIG. 7 shows, in addition to the VSL signal and the reference signal, the transfer pulse TRG that is given to the (gate of) transfer Tr 52 (FIG. 3), the reset pulse RST that is given to the reset Tr 54, the auto-zero pulse that is given from the auto-zero control unit 32 to the switches 85, 86, and 93 of the comparator 61 n (FIG. 6), the differential output of the output terminal OUTd of the differential amplifier 71 (FIG. 6), and the amplification output of the output terminal OUT1 of the output amplifier 72.

Further, in FIG. 7, the VSL signal indicates (not a voltage itself on the VSL 42$_n$ but) a voltage applied to the gate of the FET 81 of the comparator 61$_n$ (FIG. 6), and the reference signal indicates (not a voltage itself on the reference signal line 34A but) a voltage applied to the gate of the FET 82 of the comparator 61$_n$. The same holds true for the subsequent figures.

In the image sensor 2, the reset pulse RST is temporarily set to the H level, and thus the pixel 11$_{m,n}$ is reset.

As described with reference to FIG. 3, in resetting the pixel 11$_{m,n}$, the FD 53 is connected to the power supply Vdd through the reset Tr 54, and charges in the FD 53 are reset, so the VSL signal output from the pixel 11$_{m,n}$, that is, the voltage of the VSL signal on the VSL 42$_n$ output from the FD 53 through the amplification Tr 55 and the selection Tr 56 is increased in the pixel 11$_{m,n}$ and reaches a voltage corresponding to the power supply Vdd at a time $t_1$.

During a period in which the FD 53 is connected to the power supply Vdd, the VSL signal maintains the voltage corresponding to the power supply Vdd, and after that, at a time $t_2$, when the reset pulse RST becomes the L level, by the movement of the charges in the pixel 11$_{m,n}$ to some extent, a small amount of charges enter the FD 53, with the result that the VSL signal is slightly lowered.

In FIG. 7, from the time $t_2$ when the reset pulse RST becomes the L level to a time $t_3$ thereafter, the movement of the charges generated in the pixel 11$_{m,n}$ causes the VSL signal to be slightly lowered.

As described above, the lowering of the VSL signal caused after the reset of the pixel 11$_{m,n}$ is sometimes called as a reset field through.

After the reset (or during the reset) of the pixel 11$_{m,n}$, in the auto-zero control unit 32, the auto-zero pulse is set from the L level to the H level, thereby starting the auto-zero processing of the comparator 61$_n$ (FIG. 4).

In FIG. 7, at a time $t_4$ after the reset field through is generated, the auto-zero pulse is set from the H level to the L level, and the auto-zero processing for the comparator 61$_n$ is started. After that, at a time $t_5$, the auto-zero pulse is set from the H level to the L level, and the auto-zero processing for the comparator 61$_n$ is terminated (completed).

By the auto-zero processing as described above, at the time $t_5$ as timing of a rising edge of the auto-zero pulse, the comparator 61$_n$ (differential amplifier 71) is set in such a manner that it is possible to determine (compare) the magnitude relationship between the VSL signal and the reference signal with the fact that the VSL signal and the reference signal given to the comparator 61$_n$ are coincided as a reference.

In FIG. 7, the auto-zero processing is completed after the reset of the pixel 11$_{m,n}$.

In this case, the comparator 61$_n$ is set in such a manner that from the VSL signal during the reset of the pixel 11$_{m,n}$, the magnitude relationship between the VSL signal and the reference signal can be determined with the fact that the voltage decreased by the reset field through and the reference signal are coincided as a reference.

As a result, the (waveform of) reference signal is disposed on a position where the voltage decreased by the reset field through from the VSL signal during the reset of the pixel 11$_{m,n}$ is set as a reference.

At a time $t_6$ after the auto-zero processing is completed (terminated), the reference signal output unit 33 (FIG. 4) increases the reference signal by a predetermined voltage.

Here, increasing the reference signal by a predetermined voltage at the time $t_6$ after the auto-zero processing is terminated is also referred to as a start offset, hereinafter.

Further, the reference signal output unit 33 decreases the voltage of the reference signal at a constant rate for the AD conversion of the VSL signal. A part of the reference signal where the voltage of the reference signal is decreased at a certain rate is also referred to as a slope.

At the time $t_6$, the reference signal output unit 33 performs the start offset for offsetting the reference signal by a predetermined voltage in a direction opposite to a slope direction (direction in which the voltage of the reference signal is changed).

After that, the reference signal output unit 33 decreases the voltage of the reference signal at a constant rate for a certain period from a time $t_7$ to a time $t_9$.

Thus, the reference signal from the time $t_7$ to the time $t_9$ forms a slope.

The slope of the reference signal from the time $t_7$ to the time $t_9$ is a slope for performing the AD conversion for a reset level in the VSL signal (VSL signal immediately after the reset of the pixel $11_{m,n}$ (VSL signal after the pixel $11_{m,n}$ is reset, and the decrease of the voltage by the reset field through is caused)). Hereinafter, the slope period (period from the time $t_7$ to the time $t_9$) is also referred to as a P (Preset) phase. Further, the slope in the P phase is also referred to as a P phase slope.

Here, the comparator $61_n$ is set in such a manner that, by the auto-zero processing after the reset of the pixel $11_{m,n}$, the (voltages of) VSL signal and the reference signal at the auto-zero processing are coincided. Therefore, by the start offset by which the reference signal is increased by the predetermined voltage at the time $t_6$ after the auto-zero processing is terminated, the voltage of the reference signal becomes larger than that of the VSL signal (reset level). Thus, the comparator $61_n$ outputs, at the time $t_7$ when the P phase is started, a comparison result indicating that the reference signal is larger than the VSL signal.

That is, the differential output of the differential amplifier 71 becomes the H level, and the amplification output of the output amplifier 72 becomes the L level.

The counter $62_n$ of the ADC $31_n$ (FIG. 4) starts counting the clock from the time $t_7$ when the P phase slope is started, for example.

At the P phase, the (voltage of) reference signal is decreased. In FIG. 7, at a time $t_8$ in the P phase, the reference signal and the VSL signal as the reset level are coincided, and the magnitude relationship between the reference signal and the VSL signal is reversed at the start of the P phase.

As a result, the comparison result output from the comparator $61_n$ is reversed from the start of the P phase, and the comparator $61_n$ starts to output the comparison result indicating that the VSL signal as the reset level is larger than the reference signal.

That is, the differential output of the differential amplifier 71 becomes the L level, and the amplification output of the output amplifier 72 becomes the H level.

When the comparison result output from the comparator $61_n$ is reversed, that is, when the amplification output of the output amplifier 72 as the output of the comparator $61n$ becomes the H level, the counter $62_n$ of the ADC $31_n$ (FIG. 4) terminates the counting of the clock and the count value of the counter $62_n$ at that time is the AD conversion result of the reset level (reset level AD value).

After the end of the P phase, in the image sensor 2, from a time $t_{10}$ to a time $t_{11}$, the transfer pulse TRG is set from the L level to the H level. As a result, in the pixel $11_{m,n}$ (FIG. 3), the charges accumulate in the PD 51 by the photoelectric conversion are transferred to the FD 53 through the transfer Tr 52 and accumulated.

The charges are accumulated from the PD 51 to the FD 53, with the result that the voltage of the VSL signal corresponding to the charges accumulated in the FD 53 is decreased. When the transfer pulse TRG is changed from the H level to the L level at the time $t_{11}$, the transfer of the charges from the PD 51 to the FD 53 is terminated, and the VSL signal becomes a signal level (voltage) corresponding to the charges accumulated in the FD 53.

Further, after the end of the P phase, the reference signal output unit 33 (FIG. 4) increases the reference signal to the same voltage as that at the start of the P phase, for example.

As described above, the VSL signal becomes the voltage corresponding to the charges accumulated in the FD 53, and the reference signal is increased to be the same voltage as that at the start of the P phase, with the result that the magnitude relationship between the reference signal and the VSL signal is reversed again.

As a result, the differential output of the differential amplifier 71 becomes the H level, and the amplification output of the output amplifier 72 becomes the L level.

After the reference signal is increased to be the same voltage as that at the start of the P phase, the reference signal output unit 33 (FIG. 4) decreases the voltage of the reference signal at the same change rate as in the case of the P phase for a certain period from a time $t_{12}$ to a time $t_{14}$ (which does not have to coincide with the certain period from the time t7 to the time t9).

Thus, the reference signal from the time t12 to the time t14 forms the slope like the reference signal from the time t7 to the time t9.

The slope of the reference signal from the time $t_{12}$ to the time $t_{14}$ is a slope for performing the AD conversion for the signal level in the VSL signal (in the pixel $11_{m,n}$ (FIG. 3), the VSL signal immediately after the transfer of the charges from the PD 51 to the FD 53). Hereinafter, a period of this slope (period from the time $t_{12}$ to time $t_{14}$) is also referred to as a D (Data) phase. Further, the slope of the D phase is also referred to as a D phase slope.

Here, at the start time $t_{12}$ of the D phase, as in the case of the start time $t_7$ of the P phase, the reference signal is larger than the (voltage of) VSL signal. Thus, at the start time $t_{12}$ of the D phase, the comparator $61_n$ outputs a comparison result indicating that the reference signal is larger than the VSL signal.

That is, the differential output of the differential amplifier 71 becomes the H level, and the amplification output of the output amplifier 72 becomes the L level.

The counter $62_n$ of the ADC $31_n$ (FIG. 4) starts counting the clock from the start time $t_{12}$ of the D phase slope, for example.

In the D phase, the (voltage of) reference signal is decreased, and in FIG. 7, at the time $t_{13}$ in the D phase, the reference signal and the VSL signal as the signal level are coincided, and the magnitude relationship between the reference signal and the VSL signal is reversed from the start of the D phase.

As a result, the comparison result output from the comparator $61_n$ is also reversed from the start of the D phase, and the comparator $61_n$ outputs a comparison result indicating that the VSL signal as the signal level is larger than the reference signal.

That is, the differential output of the differential amplifier 71 becomes the L level, and the amplification output of the output amplifier 72 becomes the H level.

When the comparison result output from the comparator $61_n$ is reversed, the counter $62_n$ of the ADC $31n$ (FIG. 4) terminates counting of the clock, and a count value of the counter $62_n$ at the time is the AD conversion result of the signal level (signal level AD value).

In this way, when the reset level AD value is obtained in the P phase, and when the signal level AD value is obtained in the D phase, in the image sensor 2, CDS for obtaining a difference between the reset level AD value and the signal level AD value is performed, and the difference as the result of the CDS is output as a pixel value.

Incidentally, as noises included in the pixel value output from the image sensor 2, for example, there are a noise of the amplification Tr 55 that constitutes the pixel $11_{m,n}$ (FIG. 3) and a noise of the comparator $61_n$ that constitutes the ADC $31n$ (FIG. 4).

Here, the noise of the amplification Tr 55 and the noise of the comparator $61_n$ are noises derived from a circuit, and thus are also referred to as circuit derivation noise.

As a noise included in the pixel value, for example, there is an optical shot noise based on the particle property of light, in addition to the circuit derivation noise.

For example, for an image of a dark scene such as a night scene, the circuit derivation noise gives a larger influence than the optical shot noise. For this reason, reducing the circuit derivation noise is effective.

Out of the noises included in the pixel value obtained from the pixel $11_{m,n}$, for the circuit derivation noise, for example, the AD conversion of the VSL signal obtained from the pixel $11_{m,n}$ is performed C times, namely, a plurality of times, and the AD conversion results is averaged, with the result that it is possible to achieve a reduction to $1/\sqrt{C}$ of the pixel value obtained from one AD conversion result.

For example, the assumption is made that as the plurality of times C, two is used in this case. In the ADC $31_n$, the AD conversion of the VSL signal obtained from the pixel $11_{m,n}$ is performed twice in a time division manner. In the output unit 23 (FIG. 2) or the like, an average value of the two AD conversion results is obtained, and the value is output as a final pixel value of the pixel $11_{m,n}$. As a result, it is possible to achieve a noise reduction of the pixel value, that is, to reduce the noise (circuit derivation noise) included in the pixel value to $1/\sqrt{2}$ thereof.

However, in the ADC $31_n$, in the case where the AD conversion of the VSL signal obtained from the pixel $11_{m,n}$ is performed twice in the time division manner, it takes time to perform the AD conversion to obtain the pixel value.

In view of this, description will be given on the ADC $31_n$ capable of achieving the noise reduction of the pixel value while maintaining high speed of the AD conversion.

<Second Configuration Example of ADC $31_n$>

Figure 8:
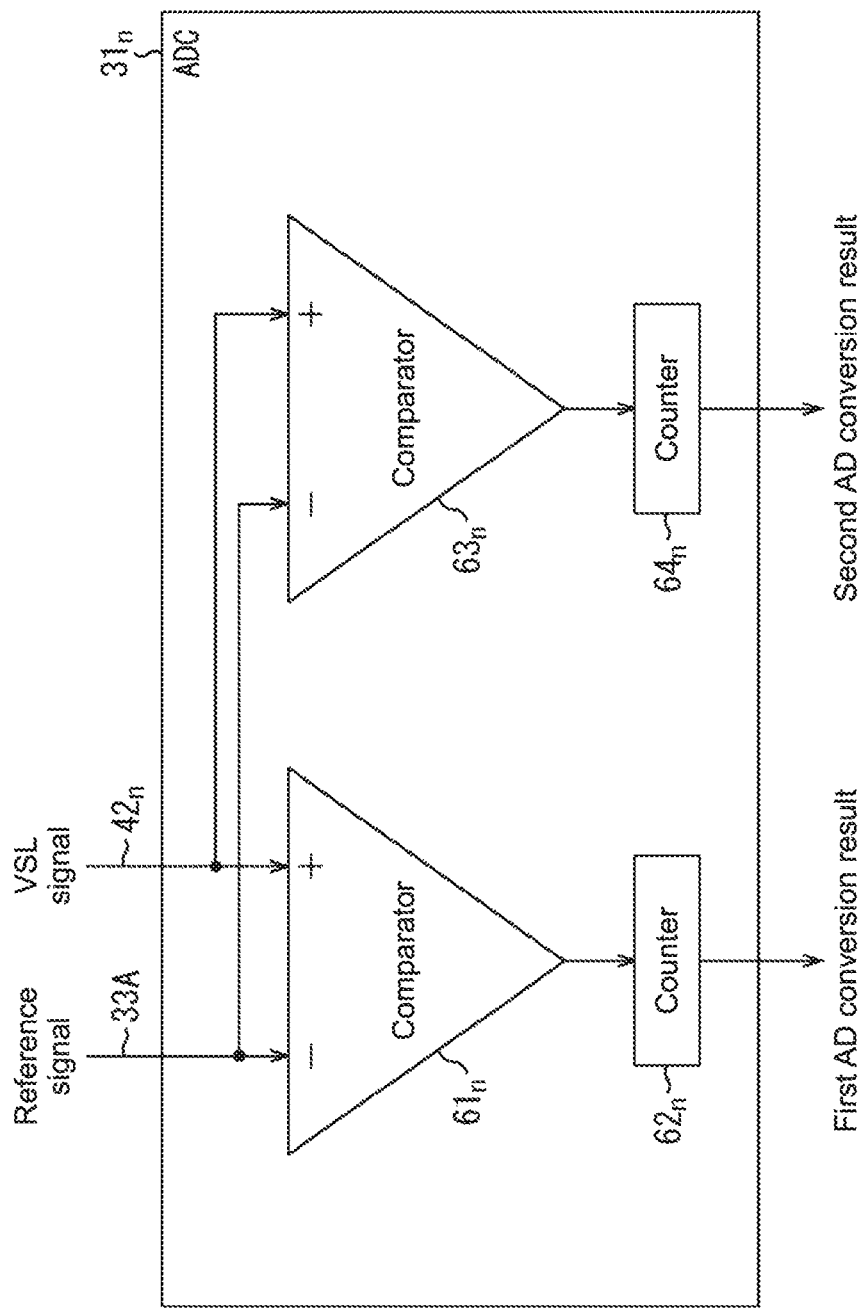
FIG. 8 A block diagram showing a second configuration example of the ADC 31n.

FIG. 8 is a block diagram showing a second configuration example of the ADC $31_n$ shown in FIG. 2.

It should be noted that, in the figure, parts corresponding to those of FIG. 4 are denoted by the same symbols, and the description thereof is appropriately omitted, hereinafter.

Further, in FIG. 8, the auto-zero control line 32A and the clock line 34A are not shown.

The ADC $31_n$ shown in FIG. 8 is common to that shown in FIG. 4 in terms of including the comparator $61_n$ and the counter $62_n$.

However, the ADC 31n shown in FIG. 8 is different from that shown in FIG. 4 in that a comparator $63_n$ and a counter $64_n$ are newly provided.

In the ADC $31_n$ shown in FIG. 8, in the comparator $61_n$ and the counter $62_n$, as described with reference to FIG. 4, by counting time until the magnitude relationship (of the voltages) between the reference signal and the VSL signal is reversed, the AD conversion of the VSL signal of the pixel $11_{m,n}$ is performed, and the AD conversion result (and a result of the CDS) of the VSL signal is output from the counter $62_n$.

Also in the comparator $63_n$ and the counter $64_n$, as in the case of the comparator $61_n$ and the counter $62_n$, by counting time until the magnitude relationship between the reference signal and the VSL signal is reversed, the AD conversion of the VSL signal of the pixel $11_{m,n}$ is performed, and the AD conversion result of the VSL signal is output from the counter $64_n$.

Here, the AD conversion result output from the counter $62_n$ is also referred to as a first AD conversion result, and the AD conversion result output from the counter $64_n$ is also referred to as a second AD conversion result.

For the first and second AD conversion results, for example, in the output unit 23 (FIG. 2), an average value of the first and second AD conversion results is obtained as a final pixel value of the pixel $11_{m,n}$.

As described above, for the VSL signal of the pixel $11_{mn}$, the AD conversion is performed in the comparator $61_n$ and the counter $62_n$, and the first AD conversion result is obtained. The AD conversion is performed in the comparator $63_n$ and the counter $64_n$, and the second AD conversion result is obtained. The average value of the first and second AD conversion results is set as the final pixel value of the pixel $11_{m,n}$, with the result that the noise (circuit derivation noise) included in the pixel value can be reduced.

Further, in FIG. 8, the AD conversion is performed for each of the set of comparator 61n and the counter 62n and the set of comparator 63n and counter 64n, so it takes the same amount of time to perform the AD conversion as the one AD conversion in the ADC 31n shown in FIG. 2.

Thus, it is possible to achieve the noise reduction of the pixel value while maintaining high speed of the AD conversion.

It should be noted that, in FIG. 2, for one VSL $42_n$, one ADC is provided, while in FIG. 8, it can be thought that for one VSL $42_n$, two ADCs are provided.

Incidentally, the ADC $31_n$ shown in FIG. 8 includes, in addition to the set of comparator $61_n$ and counter $62_n$ that constitute the ADC $31_n$ shown in FIG. 4, the set of comparator $63_n$ and counter $64_n$ that is similar to the set mentioned above.

As described with reference to FIG. 5 and FIG. 6, the comparator $61_n$ includes the differential amplifier 71 and the output amplifier 72. For the differential amplifier 71, in order to reduce the noise of the comparator $61_n$, as a transistor such as the FETs 81 and 82 that constitute the differential amplifier 71, a transistor having a large size is generally used.

Further, for the differential amplifier 71, during the operation of the comparator 61n, it is necessary to keep flowing current (bias current) in current source 89.

Thus, in the case where the comparator 61n and the comparator 63n configured in the same way as the comparator $61_n$ are provided in the ADC $31_n$, a layout area and power consumption are increased to be approximately double as compared to the case where the comparator $63_n$ is not provided.

In view of this, description will be given on the ADC $31_n$ capable of achieving the noise reduction of the pixel value while maintaining high speed of the AD conversion with the increase in the layout area and power consumption suppressed.

<Third Configuration Example of ADC $31_n$>

Figure 9:
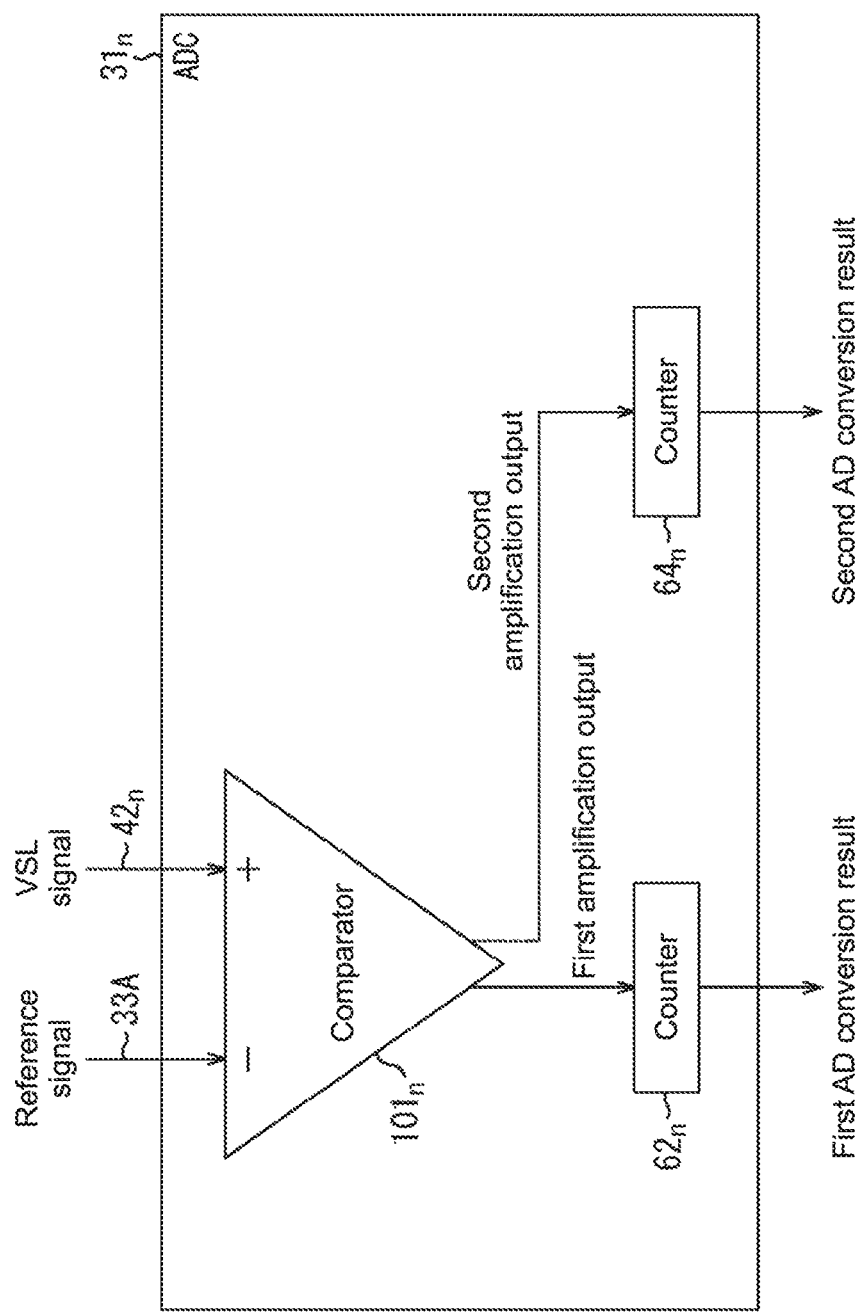
FIG. 9 A block diagram showing a third configuration example of the ADC 31n.

FIG. 9 is a block diagram showing a third configuration example of the ADC $31_n$ shown in FIG. 2.

It should be noted that, in the figure, parts corresponding to those of FIG. 8 are denoted by the same symbols, and description thereof is omitted as appropriate hereinafter.

Further, in FIG. 9, the auto-zero control line 32A and the clock line 34A are not shown, as in FIG. 8.

The ADC $31_n$ shown in FIG. 9 is common to that of FIG. 8 in terms of including two counters, namely, the counters $62_n$ and $64_n$.

However, the ADC $31_n$ shown in FIG. 9 is different from that of FIG. 8 in that one comparator $101_n$ is provided instead of the two comparators $61_n$ and $63_n$.

To the comparator $101_n$, the reference signal and the VSL signal are supplied.

Like the comparator $61_n$, the comparator $101_n$ outputs the L level as an output signal in the case where the (voltage of) reference signal is larger than the (voltage of) VSL signal, and outputs the H level in the case where the VSL signal is larger than the reference signal.

However, the comparator $101_n$ outputs a plurality of, for example, two output signals, namely, a first amplification output and a second amplification output.

The first amplification output is supplied to the counter $62_n$, and the second amplification output is output to the counter $64_n$.

In the counter $62_n$, on the basis of the first amplification output, as described with reference to FIG. 4 and FIG. 7, the time until the magnitude relationship between (the voltages of) the reference signal and the VSL signal is reversed is counted, that is, time from a predetermined timing (for example, timing when the P phase or the D phase is started) until the first amplification output is changed from the L level to the H level is counted. A count value thus obtained is output as the first AD conversion result (and the result of the CDS) of the VSL signal of the pixel $11_{m,n}$.

Also in the counter $64_n$, like the counter $62_n$, on the basis of the second amplification output, the time until the magnitude relationship between the reference signal and the VSL signal is reversed is counted, that is, time from a predetermined timing until the second amplification output is changed from the L level to the H level is counted. A count value thus obtained is output as the second AD conversion result of the VSL signal of the pixel $11_{m,n}$.

As in the case of FIG. 8, for the first and second AD conversion results, for example, in the output unit 23 (FIG. 2), an average value of the first and second AD conversion results is obtained as a final pixel value of the pixel $11_{m,n}$.

Thus, by the ADC $31_n$ shown in FIG. 9, as in the case of FIG. 8, the average value of the first and second AD conversion results is obtained as the final pixel value of the pixel $11_{m,n}$, with the result that it is possible to reduce the noise (circuit derivation noise) included in the pixel value.

Further, in FIG. 9, on the basis of the first amplification output and the second amplification output, which are the two output signals output from the comparator $101_n$, the counters $62_n$ and $64_n$ each perform the counting, thereby performing the AD conversions to obtain the first and second AD conversion results. Therefore, the AD conversion can only require the same amount of time to perform one AD conversion by the ADC $31_n$ shown in FIG. 2.

Thus, it is possible to achieve the noise reduction while maintaining high speed of the AD conversion.

Further, only one comparator, namely, the comparator $101_n$ is provided in the ADC $31_n$ shown in FIG. 9. This can suppress an increase in the layout area and power consumption as compared to the case where the two comparators, namely, the comparators $61_n$ and $63_n$ are provided as shown in FIG. 8.

In this way, by the ADC $31_n$ shown in FIG. 9, it is possible to achieve the noise reduction while maintaining high speed of the AD conversion with the increase in the layout area and power consumption suppressed.

<Configuration Example of Comparator $101_n$>

Figure 10:
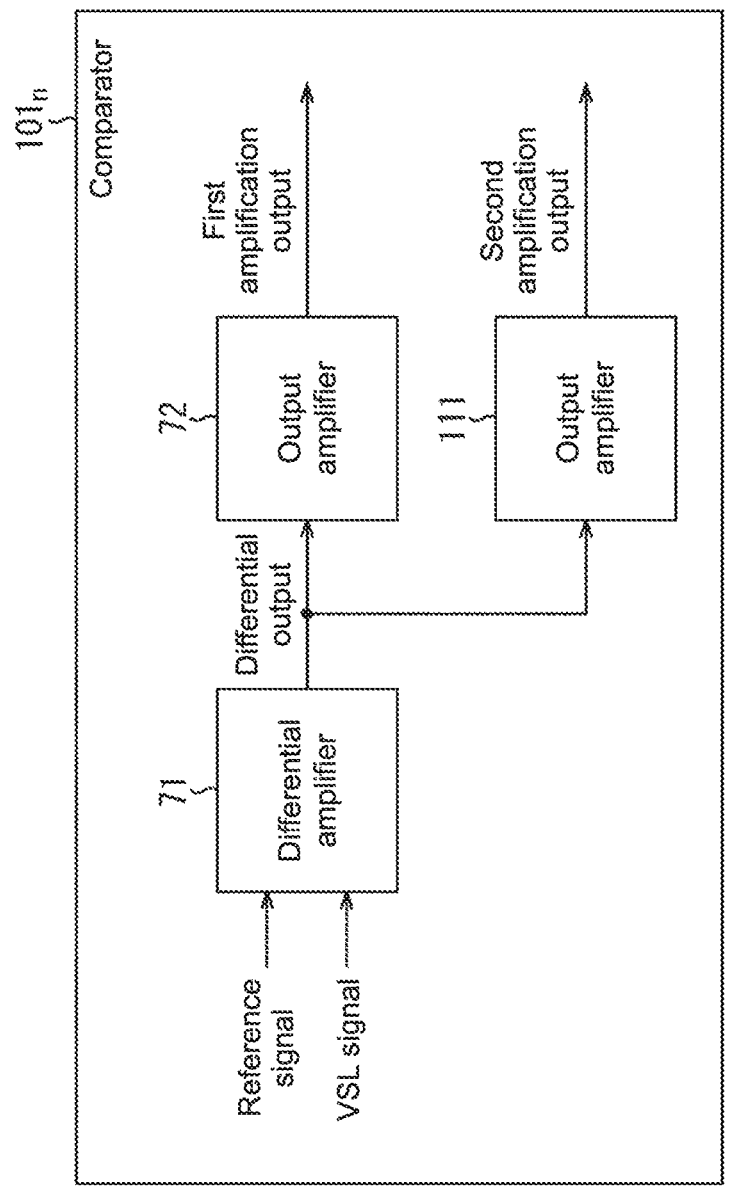
FIG. 10 A block diagram showing a configuration example of a comparator 101n.

FIG. 10 is a block diagram showing a configuration example of the comparator $101_n$ shown in FIG. 9.

It should be noted that, in the figure, parts corresponding to the comparator $61_n$ shown in FIG. 5 are denoted by the same symbols, and description thereof is omitted as appropriate, hereinafter.

The comparator $101_n$ shown in FIG. 10 is common to the comparator $61n$ shown in FIG. 5 in terms of having the differential amplifier 71 and the output amplifier 72.

However, the comparator $101_n$ shown in FIG. 10 is different from the comparator $61_n$ shown in FIG. 5 in that an output amplifier 111 is newly provided. In the comparator $101_n$, the differential output of the differential amplifier 71 is supplied to the output amplifiers 72 and 111.

Thus, in the comparator $101n$, it can be said that one differential amplifier 71 is shared by the plurality of, in this case, two output amplifiers 72 and 111.

As described with reference to FIG. 5, the output amplifier 72 functions as a buffer for buffering the differential output in order to output the differential output (comparison result signal) from the differential amplifier 71 to a subsequent circuit at an appropriate level.

That is, the output amplifier 72 amplifies the differential output from the differential amplifier 71 with a predetermined gain, and outputs a signal as a result of the amplification as the first amplification output.

The first amplification output of the output amplifier 72 is supplied as a final signal of the comparator $101_n$ which indicates a comparison result obtained by comparing the reference signal and the VSL signal to the counter $62_n$ (FIG. 9).

The output amplifier 111 also functions as a buffer for buffering the differential output from the differential amplifier 71 like the output amplifier 72.

That is, like the output amplifier 72, the output amplifier 111 amplifies the differential output from the differential amplifier 71 with a predetermined gain, and outputs a signal obtained as a result of the amplification as the second amplification output.

The second amplification output of the output amplifier 111 is supplied as a final signal of the comparator $101_n$ which indicates a comparison result obtained by comparing the reference signal and the VSL signal to the counter $64_n$ (FIG. 9).

However, in the output amplifiers 72 and 111, the first amplification output and the second amplification output are output at different timings. Thus, in the ADC $31_n$, the counters $62_n$ and $64_n$ count different times as the AD conversion results of the VSL signal, and the AD conversion result thus obtained are AD conversion results of different systems.

<Configuration Examples of Differential Amplifier 71 and Output Amplifiers 72 and 111>

Figure 11:
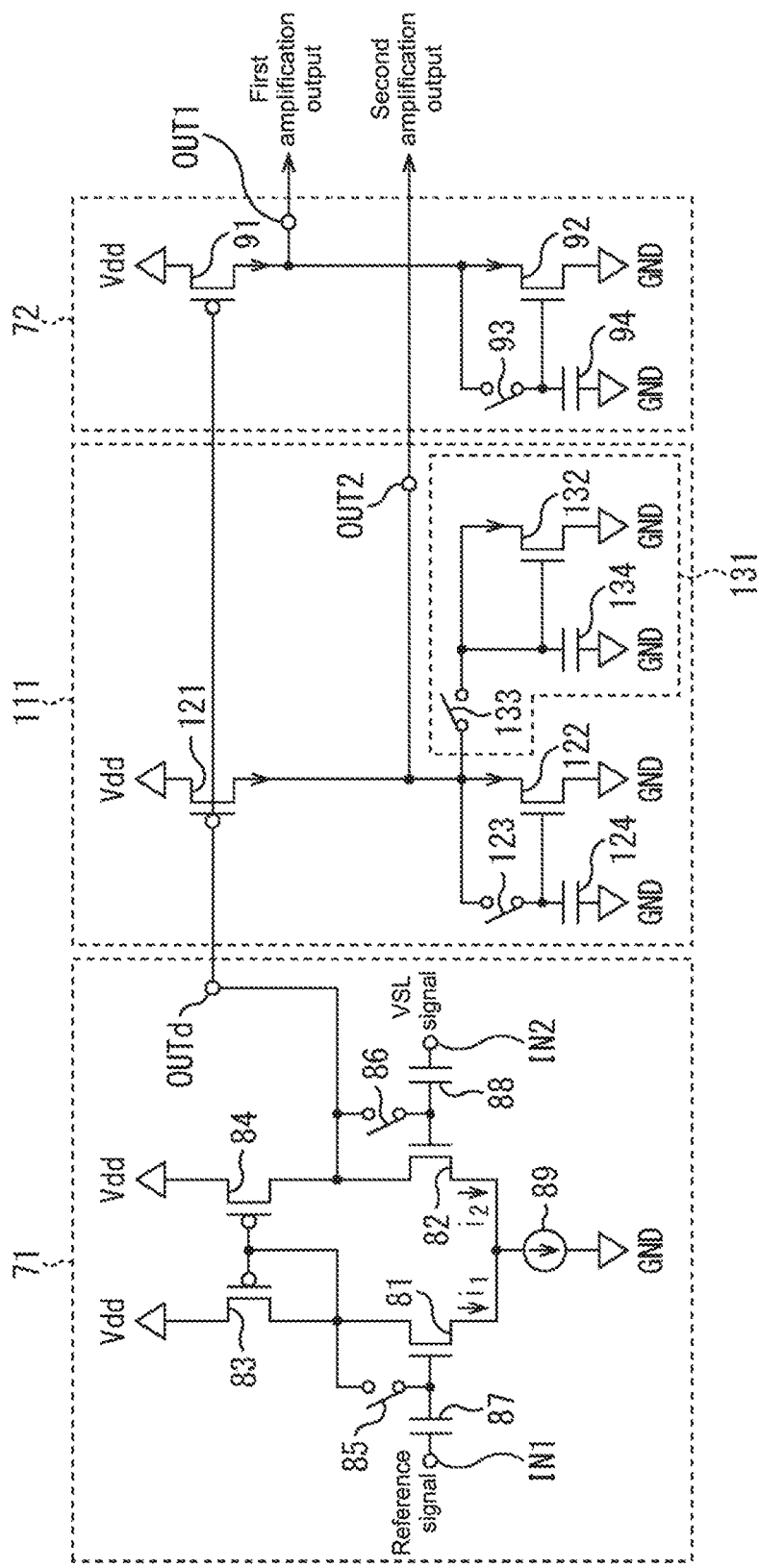
FIG. 11 A circuit diagram showing a configuration example of the differential amplifier 71, the output amplifier 72, and an output amplifier 111.

FIG. 11 is a circuit diagram showing configuration examples of the differential amplifier 71 and the output amplifiers 72 and 111 shown in FIG. 10.

It should be noted that, in the figure, parts corresponding to those of FIG. 6 are denoted by the same symbols, and description thereof is omitted as appropriate, hereinafter.

In FIG. 11, the differential amplifier 71 and the output amplifier 72 are configured in the same way as those shown in FIG. 6.

Here, as described with reference to FIG. 6, from the output terminal OUT1 of the output amplifier 72, a voltage at the connection point of the drain of the FET 91 and the drain of the FET 92 is output. This voltage is the first amplification output.

In FIG. 11, the output amplifier 111 includes FETs 121 and 122, a switch 123, a capacitor 124, and a timing control unit 131.

The FETs 121 to the capacitor 124 are configured in the same way as the FET 91 to the capacitor 94 of the output amplifier 72.

That is, the FET 121 is a PMOS FET, and a gate thereof is connected to the output terminal OUTd of the differential amplifier 71. A source of the FET 121 is connected to the power supply Vdd, and a drain thereof is connected to a drain of the FET 122.

The FET 122 an NMOS FET and functions as a current source. A gate of the FET 122 is connected to one end of the capacitor 124, and a source thereof is grounded.

For example, the switch 123 is a switch configured by an FET or the like, and is turned on or off on the basis of the auto-zero pulse supplied from the auto-zero control unit 32.

That is, the switch 123 is turned on or off in such a manner that the gate and the drain of the FET 122 is connected or disconnected on the basis of the auto-zero pulse.

The one end of the capacitor 124 is connected to the gate of the FET 122, and the other end thereof is grounded.

It should be noted that a connection point of the drain of the FET 121 and the drain of the FET 122 is connected to the output terminal OUT2 of the output amplifier 111, and a voltage of the connection point of the drain of the FET 121 and the drain of the FET 122 is output as the second amplification output from the output terminal OUT2.

The timing control unit 131 performs timing control so as to output the first amplification output of the output amplifier 72 and the second amplification output of the output amplifier 111 with a predetermined time shifted.

That is, the timing control unit 131 controls reverse timing of the second amplification output in such a manner that a reverse timing when the first amplification output of the output amplifier 72 is reversed (from the L level to the H level or from the H level to the L level) and a reverse timing when the second amplification output of the output amplifier 111 is reversed are not coincided.

The timing control unit 111 includes an FET 132, a switch 133, and a capacitor 134.

The FET 132 is an NMOS FET and functions as a current source. A gate of the FET 132 is connected to one end of the capacitor 134, and a source thereof is grounded. Further, a drain and the gate of the FET 132 are connected, and a connection point of the drain and the gate is connected to the drain of the FET 121 through the switch 133.

For example, the switch 133 is a switch configured by an FET or the like, and is turned on or off on the basis of the auto-zero pulse supplied from the auto-zero control unit 32.

That is, on the basis of the auto-zero pulse, the switch 133 is turned on or off in such a manner that the drain of the FET 132 and the drain of the FET 121 are connected or disconnected.

The one end of the capacitor 134 is connected to the gate of the FET 132, and the other end thereof is grounded.

In the comparator 101$_n$ configured as described above, in the case where the (voltage of) reference signal is larger than the (voltage of) VSL signal, as described with reference to FIG. 6, the differential output of the output terminal OUTd of the differential amplifier 71 is the H level.

In the case where the differential output is the H level, as described with reference to FIG. 6, in the output amplifier 72, the FET 91 is off, and the drain of the FET 91 is at the L level. Therefore, the first amplification output of the output terminal OUT1 connected to the drain is the L level.

In the case where the differential output is the H level, as in the output amplifier 72, the FET 121 is also off, and the drain of the FET 121 is also at the L level in the output amplifier 111, so the second amplification output of the output terminal OUT2 connected to the drain is the L level.

On the other hand, in the case where the VSL signal is larger than the reference signal, as described with reference to FIG. 6, the differential output of the output terminal OUTd of the differential amplifier 71 is the L level.

In the case where the differential output is the L level, as described with reference to FIG. 6, in the output amplifier 72, the FET 91 is on, and the drain of the FET 91 is at the H level, so the first amplification output of the output terminal OUT1 connected to the drain is the H level.

In the case where the differential output is the H level, as in the output amplifier 72, in the output amplifier 111, the FET 121 is also on, and the drain of the FET 121 is at the H level. Therefore, the second amplification output of the output terminal OUT2 connected to the drain is the H level.

In this way, as described with reference to FIG. 7, in the case where the (voltage of) reference signal is decreased at the constant rate, both of the first amplification output and the second amplification output are L level during the period when the reference signal is larger than the VSL signal, and the reference signal is coincided with the VSL signal. When the magnitude relationship thereof is reversed, both of the first amplification output and the second amplification output are changed from the L level to the H level.

However, in the comparator 101$_n$, in order to obtain, as the first AD conversion result obtained on the basis of the first amplification output of the output amplifier 72 and the second AD conversion result obtained on the basis of the second amplification output of the output amplifier 111, the AD conversion results of the different systems, the timing control unit 131 controls the second amplification output reverse timing in such a manner that a timing when the level of the first amplification output is reversed (hereinafter, also referred to as first amplification output reverse timing) and a timing when the level of the second amplification output is reversed (hereinafter, also referred to as second amplification output reverse timing) are not coincided.

Figures 12A, 12B:
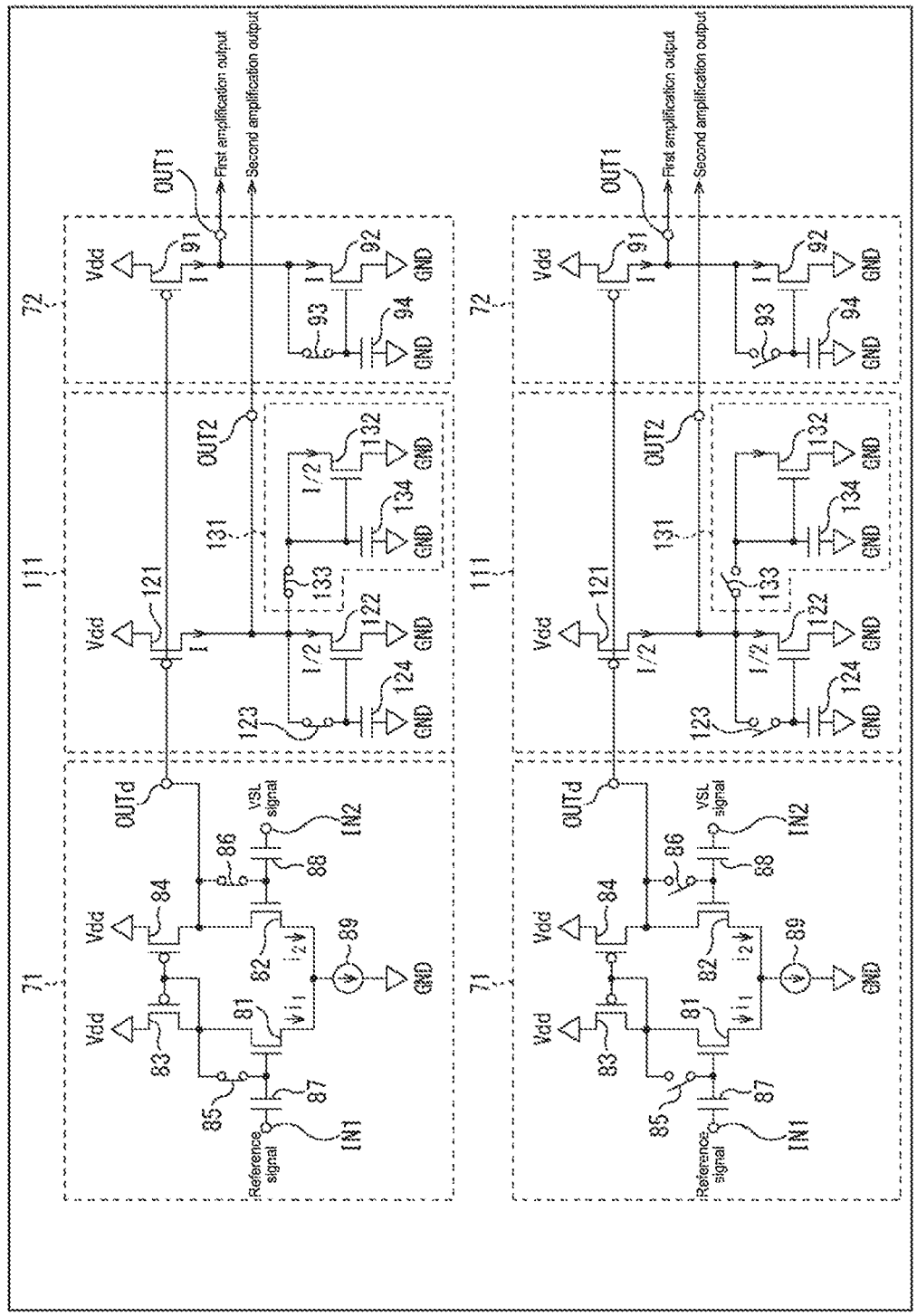
FIGS. 12A and 12B Diagrams for explaining a method of controlling a second amplifier output reverse timing in such a manner that a first amplification output reverse timing and the second amplification output reverse timing are not coincided.

FIGS. 12A and 12B shows diagrams for explaining a method of controlling the second amplification output reverse timing in such a manner that the first amplification output reverse timing and the second amplification output reverse timing are not coincided.

FIG. 12A shows the differential amplifier 71 and the output amplifiers 72 and 111 at the time of auto-zero processing.

At the time of auto-zero processing, the auto-zero pulse is the H level. In the case where the auto-zero pulse is the H level, the switches 85 and 86 are on, as described with reference to FIG. 6, the auto-zero processing is performed.

Further, in the case where the auto-zero pulse is the H level, the switches 93, 123, and 133 are on.

In the case where the switches 93, 123, and 133 are on, the voltages of the gates and the drains of the FETs 92, 122, and 132 are identical.

Thus, in the case where the switches 93, 123, and 133 are on, the assumption is made that a bias current that is caused to flow (to the FET 91) by the FET 92 as the current source is represented by I. A bias current that is caused to flow (to the FET 121) by the FETs 122 and 132 as the current sources is I.

In this case, when the assumption is made that the FETs 122 and 123 have the same size, the FETs 122 and 132 each cause the same bias current to flow, so the bias currents that are caused to flow by the FETs 122 and 132 are I/2.

FIG. 12B shows the differential amplifier 71 and the output amplifiers 72 and 111 at times other than the auto-zero processing.

At times other than the auto-zero processing, the auto-zero pulse is the L level. In the case where the auto-zero pulse is the L level, the switches 85, 86, 93, 123, and 133 are off.

In the output amplifier 72, as described with reference to FIG. 6, when the switch 93 is on, the capacitor 94 is charged to have the same voltage as the drain voltage of the FET 92. Then, when the switch 93 is off, the voltage of the capacitor 94 is applied to the gate of the FET 92, and the FET 92 causes the bias current I to flow which is the same as the bias current I caused to flow when the switch 93 is on.

On the other hand, in the output amplifier 111, when the switches 123 and 133 are on, the capacitors 124 and 134 are charged in such a manner that the FETs 122 and 132 each cause the bias current I/2 to flow.

Then, when the switches 123 and 133 are off, the voltage of the capacitor 124 is applied to the gate of the FET 122, and the FET 122 causes the same bias current I/2 to flow as the bias current I/2 caused to flow when the switch 123 is on.

However, when the switches 123 and 133 are off, the drain of the FET 132 that constitutes the timing control unit 131 is disconnected from the drain of the FET 121, so the current (bias current) is not caused to flow in the FET 132.

As a result, the bias current caused to flow in the FET 121 is only a current caused to flow by the FET 122, namely, I/2.

As described above, at times other than the auto-zero, the bias current caused to flow in the FET 92 of the output amplifier 72 is I, but the bias current caused to flow in the FET 121 of the output amplifier 111 is I/2, so the difference can be generated between the bias current caused to flow in the FET 91 of the output amplifier 72 and the bias current caused to flow in the FET 121 of the output amplifier 111.

When the gate voltages of the PMOS FETs 91 and 121 are changed from the H level to the L level and are on, out of the drain voltages of the FETs 91 and 121, that is, the first amplification output of the output terminal OUT1 and the second amplification output of the output terminal OUT2, one having a smaller bias current, that is, the second amplification output as the drain voltage of the FET 121 is more quickly reversed from the L level to the H level in this case.

As described above, when the (voltage of) reference signal is reduced at the constant rate, the reference signal coincides with the VSL signal, and the magnitude relationship thereof is reversed, the differential output of the output terminal OUTd of the differential amplifier 71, which is supplied as the gate voltage of the FETs 91 and 121 is changed from the H level to the L level. As a result, both of the levels of the first amplification output and the second amplification output are reversed from the L level to the H level. However, the difference is generated between the bias current caused to flow in the FET 92 of the output amplifier 72 and the bias current caused to flow in the FET 121 of the output amplifier 111, and therefore the output timings of the first amplification output and the second amplification output are not coincided. That is, in this embodiment, the second amplification output is reversed at an earlier timing than the first amplification output.

<Operation of Image Sensor 2>

Figure 13:
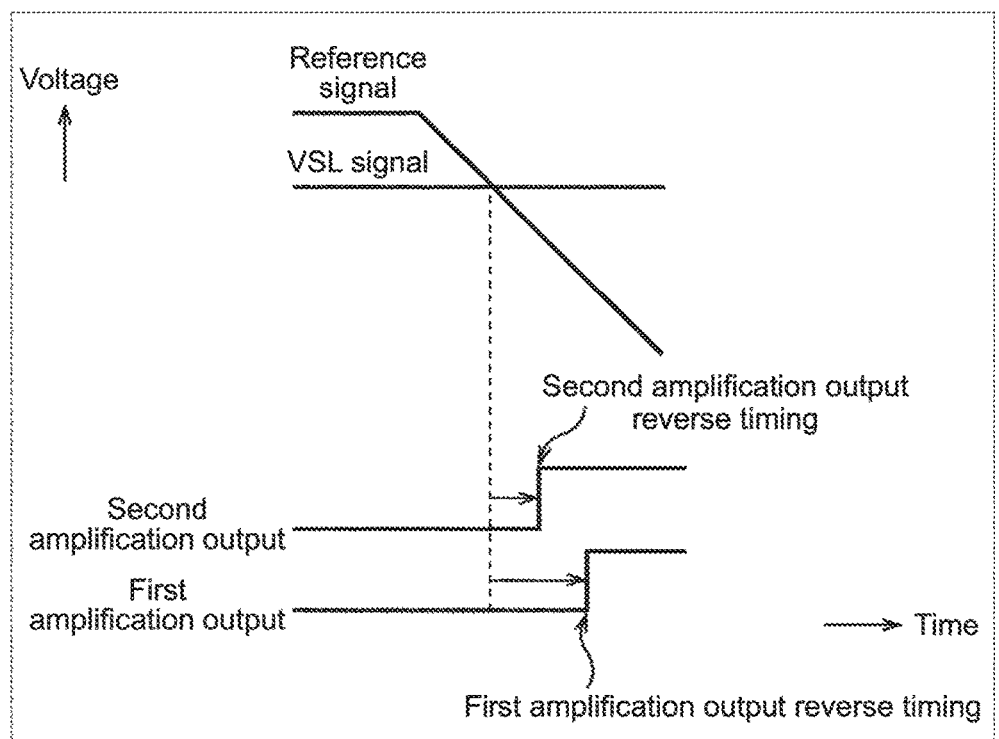
FIG. 13 A diagram for explaining an operation of the image sensor 2.

FIG. 13 is a diagram for explaining the operation of the image sensor 2 (FIG. 2) in the case where the differential amplifier 71 and the output amplifiers 72 and 111 are configured as shown in FIGS. 12A and 12B.

It should be noted that, in FIG. 13, the horizontal axis represents time, and the vertical axis represents voltage.

When the reference signal is reduced at the constant rate, the reference signal coincides with the VSL signal, and the magnitude relationship thereof is reversed, both of the levels of the first amplification output and the second amplification output are reversed from the L level to the H level.

However, the first amplification output and the second amplification output are reversed at different timings.

That is, in this embodiment, as described with reference to FIGS. 12A and 12B, the second amplification output is reversed at an earlier timing than the first amplification output.

In the counter $62_n$ (FIG. 9), on the basis of the first amplification output, time (from a timing of the head of the P phase or D phase, for example) until the first amplification output is reversed from the L level to the H level (first amplification output reverse timing) is counted. A count value thus obtained is output as the first AD conversion result of the VSL signal of the pixel $11_{m,n}$.

Further, in the counter $64_n$ (FIG. 9), on the basis of the second amplification output, (from a timing of the head of the P phase or D phase, for example) until the second amplification output is reversed from the L level to the H level (second amplification output reverse timing) is counted. A count value thus obtained is output as the second AD conversion result of the VSL signal of the pixel $11_{m,n}$.

Then, an average of the first and second AD conversion results is obtained, with the result that a pixel value with a reduced noise is obtained.

<Fourth Configuration Example of ADC $31_n$>

Figure 14:
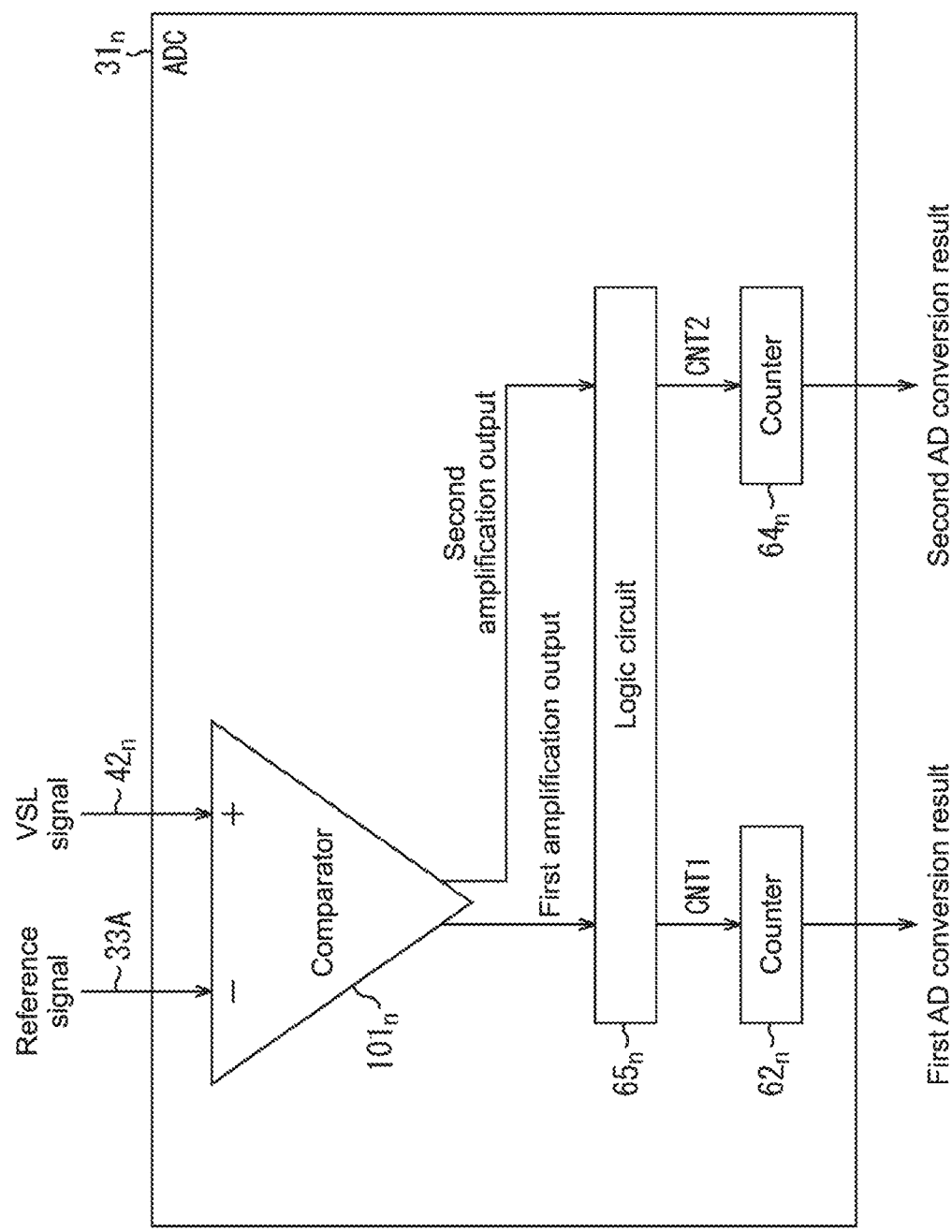
FIG. 14 A block diagram showing a fourth configuration example of the ADC $31_n$.

FIG. 14 is a block diagram showing a fourth configuration example of the ADC $31_n$ shown in FIG. 2.

It should be noted that, in the figure, parts corresponding to those of FIG. 9 are denoted by the same symbols, and description thereof is omitted as appropriate, hereinafter.

Further, in FIG. 14, as in FIG. 8 and FIG. 9, the auto-zero control line 32A and the clock line 34A are not shown.

The ADC $31_n$ shown in FIG. 14 is common to that shown in FIG. 9 in terms of having the comparator 101$n$ and the counters 62$n$ and 64$n$.

However, the ADC 31$n$ shown in FIG. 14 is different from that shown in FIG. 9 in that a logic circuit 65$n$ is newly provided.

The logic circuit 65$n$ uses the first amplification output and the second amplification output from the comparator $101_n$, thereby generating a control signal CNT1 for controlling counting of the counter $62_n$ and a control signal CNT2 for controlling counting of the counter $64_n$, supplies the control signal CNT1 to the counter $62_n$, and supplies the control signal CNT2 to the counter $64_n$.

Here, in the ADC $31_n$ shown in FIG. 9, the counter $62_n$ counts time from a predetermined timing, for example, a timing of the head of the P phase or D phase till the first amplification output reverse timing when the first amplification output is reversed from the L level to the H level, and the counter $64_n$ counts time from a predetermined timing till the second amplification output reverse timing when the second amplification output is reversed from the L level to the H level.

In this embodiment, as shown in FIG. 13, the first amplification output reverse timing is later than the second amplification output reverse timing. Therefore, the assumption is made that time from the second amplification output reverse timing till the first amplification output reverse timing, that is, a difference between the first amplification output reverse timing and the second amplification output reverse timing is represented by a differential time Δt. The counter $62_n$ counts (the same) time overlapped with the counter $64_n$ and counts the differential time Δt.

The counters $62_n$ and $64_n$ consume power when counting time. Counting the overlapped time by the counters $62_n$ and $64_n$ results in a waste of power.

In view of this, the ADC $31_n$ shown in FIG. 14 is configured to achieve low power consumption by causing the counter $62_n$, which is the counter that counts time till the first amplification output reverse timing out of the plurality of counters, two counters $62_n$ and $64_n$ in this case, to count the differential time Δt from time counted by the other counter, namely, the counter $64_n$, with the result that the overlapped time with the counter $64_n$ is prevented from being counted.

That is, in the ADC $31_n$ shown in FIG. 14, to the counter $62_n$, instead of the first amplification output, the control signal CNT1 output from the logic circuit $65_n$ is supplied, and to the counter $64_n$, instead of the second amplification output, the control signal CNT2 output from the logic circuit $65_n$ is supplied.

As in the case where the first amplification output is supplied thereto, on the basis of the control signal CNT1 supplied from the logic circuit $65_n$, the counter $62_n$ continues counting the clock during a period in which the control signal CNT1 is the L level, and terminates the counting when the control signal CNT1 is changed from the L level to the H level.

As in the case where the second amplification output is supplied thereto, on the basis of the control signal CNT2 supplied from the logic circuit 65n, the counter $64_n$ also continues counting the clock during a period in which the control signal CNT2 is the L level, and terminates the counting when the control signal CNT2 is changed from the L level to the H level.

By using the first amplification output and the second amplification output from the comparator $101_n$, the logic circuit $65_n$ generates the control signal CNT1 that is the L level only during the differential time Δt and generates the control signal CNT2 similar to the second amplification output.

That is, the logic circuit 65n generates the control signal CNT1 of the L level, only when the first amplification output is the L level, and the second amplification output is the H level, and generates the control signal CNT2 the level of which is changed in the same way as the second amplification output.

In the counters $62_n$ and $64_n$, the clocks are counted on the basis of the control signals CNT1 and CNT2 as described above, and thus in the counter $62_n$, only the differential time Δt from the time counted by the counter $64_n$ is counted, to avoid counting the overlapped time with the counter $64_n$. As a result, it is possible to achieve the reduction in power consumption.

Figure 15:
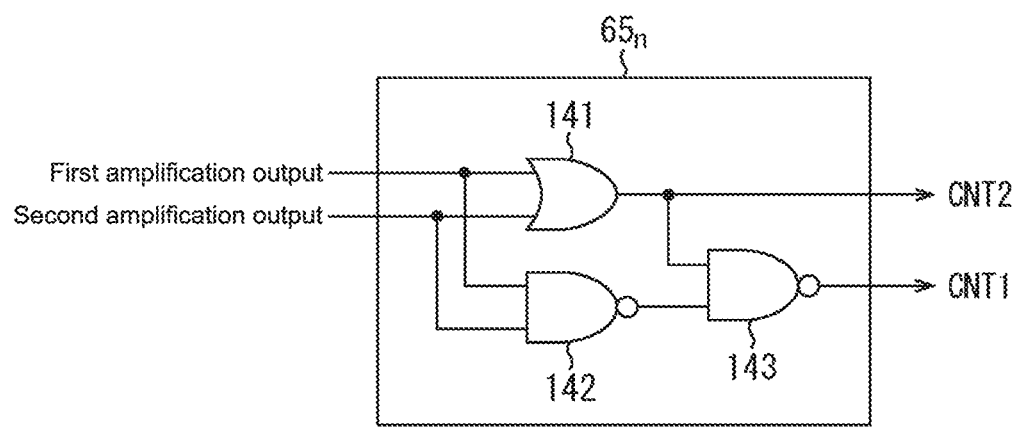
FIG. 15 A circuit diagram showing a configuration example of a logic circuit 65n.

FIG. 15 is a circuit diagram showing a configuration example of the logic circuit $65_n$ shown in FIG. 14.

In FIG. 15, the logic circuit $65_n$ is constituted of an OR gate 141 of two inputs and one output and NAND gates 142 and 143.

The first amplification output and the second amplification output are supplied to the OR gate 141 and the NAND gate 142.

The OR gate 141 performs an OR operation for the first amplification output and the second amplification output, and supplies a result of the operation to the NAND gate 143 while outputting the result as the control signal CNT2.

The NAND gate 142 performs a NAND operation for the first amplification output and the second amplification output, and supplies a result of the operation to the NAND gate 143.

The NAND gate 143 performs a NAND operation for the operation result of the OR gate 141 and the operation result of the NAND gate 142, and outputs the operation result as the control signal CNT1.

Figure 16A:
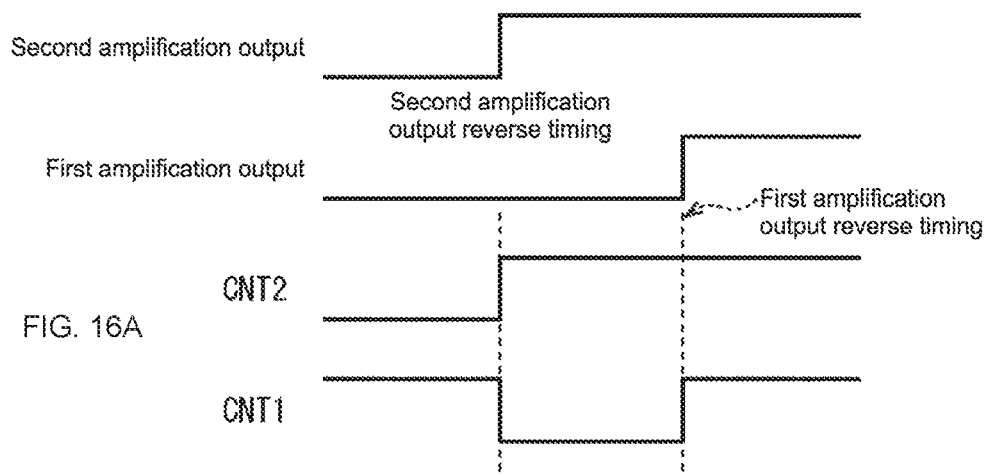
FIGS. 16A, 16B and 16C Diagrams showing examples of a first amplification output, a second amplification output, control signals CNT1 and CNT2, a count value v1 of a counter $62_n$, and a count value v2 of a counter $64_n$.
Figure 16B:
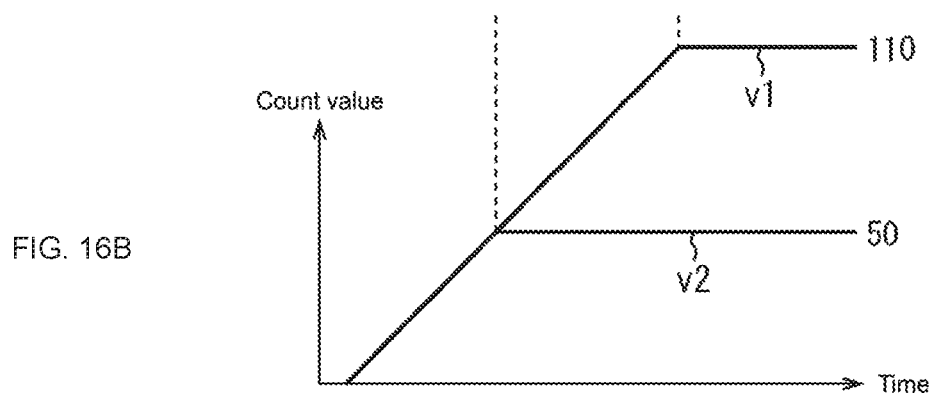
Figure 16C:
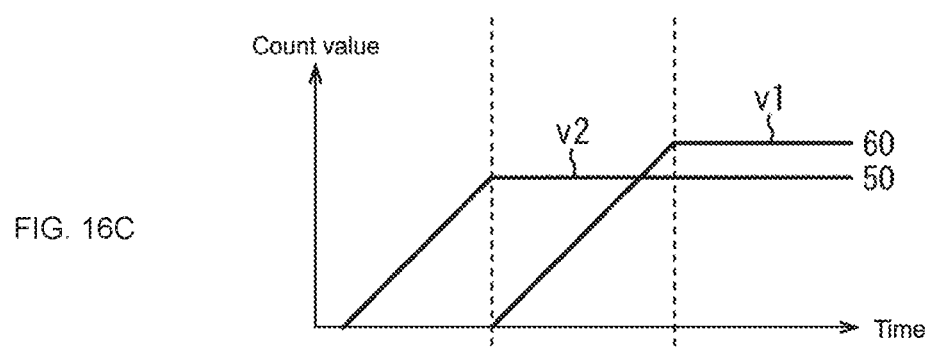

FIGS. 16A, 16B and 16C shows diagrams of waveform examples of the first amplification output, the second amplification output, and the control signals CNT1 and CNT2 and examples of a count value v1 of counter $62_n$ and a count value v2 of the counter $64_n$.

FIG. 16A shows the examples of the waveforms of the first amplification output, the second amplification output, and the control signals CNT1 and CNT2.

In FIG. 16A, as shown in FIG. 13, the second amplification output is reversed from the L level to the H level at an earlier timing than the first amplification output (the first amplification output reverse timing is later than the second amplification output reverse timing).

Further, in the case where the first amplification output is the L level, and the second amplification output is the H level, the control signal CNT1 is the L level, and in the other cases, the control signal CNT1 is the H level.

Further, the control signal CNT2 is similar to the second amplification output.

FIG. 16B shows examples of the count value v1 obtained by performing counting in accordance with the first amplification output shown in FIG. 16A by the counter $62_n$ and the count value v2 obtained by performing counting in accordance with the second amplification output shown in FIG. 16A by the counter $64_n$ in the ADC $31_n$ shown in FIG. 9.

In FIG. 16B, the counters $62_n$ and $64_n$ start counting at the same time. Then, the counter $64_n$ performs counting during a period in which the second amplification output is the L level, and stops counting at the second amplification output reverse timing when the second amplification output is changed from the L level to the H level. Further, the counter $62_n$ performs counting during a period in which the first amplification output is the L level, and stops counting at the first amplification output reverse timing when the first amplification output is changed from the L level to the H level. As a result, final count values v1 and v2 are 110 and 50, respectively.

In this case, with the count values v1=110 and v2=50 as the first and second AD conversion results, an average value of the first and second AD conversion results can be determined to be 80=(110+50)/2 as the final pixel value.

The assumption is made that the counters $62_n$ and $64_n$ are binary counters that perform counting by using binary numbers. As described above, in the case where the counter $62_n$ counts the count value v1=110 in accordance with the first amplification output, and the counter $64_n$ counts the count value v2=50 in accordance with the second amplification output, in both of the counters $62_n$ and $64_n$ as the binary counters, toggling is performed 160=110+50 times in total.

FIG. 16C shows the examples of the count value v1 obtained by performing counting in accordance with the control signal CNT1 shown in FIG. 16A by the counter $62_n$ and the count value v2 obtained by performing counting in accordance with the control signal CNT2 shown in FIG. 16A by the counter $64_n$ in the ADC $31_n$ shown in FIG. 14.

In FIG. 16C, the counter $64_n$ starts counting and continues counting during a period in which the control signal CNT2 is the L level. Then, the counter $64_n$ stops counting at the second amplification output reverse timing when the control signal CNT2 is changed from the L level to the H level. Further, at the second amplification output reverse timing when the counting is stopped, the control signal CNT1 is changed from the H level to the L level, and the counter $62_n$ starts counting. Then, the counter $62_n$ performs counting during a period in which the control signal CNT1 is the L level, and stops counting at the first amplification output reverse timing when the control signal CNT1 is changed from the L level to the H level. As a result, the final count values v1 and v2 are 60 and 50, respectively.

In this case, with the count values v1=60 and v2=50 as the first and second AD conversion results, an average value of the first AD conversion result and twice the second AD conversion result of the count value v2=50, which is to be counted by the counters $62_n$ and $64_n$, namely, 100, can be determined to be 80=(60+50*2)/2 as the final pixel value.

Alternatively, a value 110 obtained by adding the count value v1=60 of the differential time Δt and the count value v2=50 for the overlapped time is set as the first AD conversion result, and a value 110 obtained by adding thereto the count value v2=50 for the overlapped time is set as the second AD conversion result. Thus, an average value of the first and second AD conversion results can be determined to be 80=(110+50)/2 as the final pixel value.

The assumption is made that the counters $62_n$ and $64_n$ are binary counters that perform counting by using binary numbers. As described above, in the case where, in accordance with the control signal CNT1, the counter $62_n$ counts the count value v1=60, and in accordance with the control signal CNT2, the counter $64_n$ counts the count value v2=50, in both of the counters $62_n$ and $64_n$ as the binary counters, toggling is performed 110=60+50 times in total.

Thus, in the case where the counters $62_n$ and $64_n$ perform counting in accordance with the control signals CNT1 and CNT2, respectively, that is, in the counter $62_n$, the differential time Δt from the time counted by the counter $64_n$ is counted, the number of toggling in the counters $62_n$ and $64_n$ is reduced (reduced from 160 to 110 times) as compared to the case where the counters $62_n$ and $64_n$ perform counting in accordance with the first amplification output and the second amplification output. As a result, it is possible to achieve low power consumption.

It should be noted that the present technology is not limited to the above embodiment, and can be variously modified without departing from the gist of the present technology.

That is, the present technology can be applied to any electronic apparatus to which a function of taking images is provided, such as a digital camera and a mobile terminal such as a smart phone having a function of taking images with an image sensor mounted thereon.

Further, the differential amplifier 71 only has to obtain the comparison result signal that indicates the comparison result (difference between the two signals or the like) obtained by comparing the two signals, and the configuration thereof is not limited to that shown in FIG. 6 or FIG. 11.

For example, in FIG. 11, the differential amplifier 71 can be configured without the current source 89.

Further, the output amplifier 72 only has to output the differential output of the differential amplifier 71 to the subsequent circuit at an appropriate level, and the configuration thereof is not limited to that shown in FIG. 6 or FIG. 11.

For example, the output amplifier 72 can use such a configuration that a plurality of FETs is connected to multiple stages. The same holds true for the output amplifier 111.

Further, for example, in FIG. 11, the output amplifier 111 can be configured without the capacitor 134.

Further, in the comparator $101_n$, output amplifiers provided to amplify the differential output of the differential amplifier 71 are not limited to the two output amplifiers 72 and 111.

That is, for the comparator $101_n$, C (three or more) output amplifiers can be provided, and the C output amplifiers can give amplification outputs in a shifted manner. In this case, in the ADC $31_n$, it is necessary to provide C counters (similar to the counters $62_n$ and $64_n$), the number of which is the same as the C output amplifiers. By obtaining an average of C AD conversion results as count values of the C counters and determining a pixel value, it is possible to reduce a noise included in the pixel value to $1/\sqrt{C}$ times the pixel value obtained from one AD conversion result. It should be noted that, the present technology can take the following configuration.

<1>

An image sensor, including:

a pixel that has a photoelectric conversion element for performing photoelectric conversion and outputs an electrical signal;

a reference signal output unit that outputs a reference signal, a level of which is changed; and an ADC that performs AD (Analog Digital) conversion for the electrical signal by counting time necessary for a change of the reference signal to a coincidence of the electrical signal output from the pixel and the reference signal output from the reference signal output unit, in which the ADC includes a comparator that compares the electrical signal with the reference signal, and a counter that counts time necessary for a change of the reference signal to a coincidence of the electrical signal and the reference signal on the basis of output signals from the comparator, and the comparator includes a differential amplifier that outputs a comparison result signal indicating a comparison result obtained by comparing the electrical signal and the reference signal, and a plurality of output amplifiers that outputs, at different timings, signals obtained by amplifying the comparison result signal output from the differential amplifier as the output signals.

<2>

The image sensor according to <1>, in which the plurality of output amplifiers outputs the output signals at the different timings by using a difference of bias currents that flow in transistors constituting the plurality of output amplifiers.

<3>

The image sensor according to <1> or <2>, in which the ADC includes a plurality of counters, the number of which is the same as that of the plurality of output amplifiers.

<4>

The image sensor according to <3>, in which one of the plurality of counters counts differential time from time counted by a different counter.

<5>

The image sensor according to any one of <1> to <4>, in which the pixel has a pixel value determined by adding a plurality of AD conversion results of the electrical signal, which are obtained with respect to the output signals from the plurality of output amplifiers.

<6>

A drive method, including:

outputting, by a plurality of output amplifiers of an image sensor, signals obtained by amplifying a comparison result signal output from a differential amplifier as output signals at different timings, the image sensor including a pixel that has a photoelectric conversion element for performing photoelectric conversion and outputs an electrical signal, a reference signal output unit that outputs a reference signal, a level of which is changed, and an ADC that performs AD (Analog Digital) conversion for the electrical signal by counting time necessary for a change of the reference signal to a coincidence of the electrical signal output from the pixel and the reference signal output from the reference signal output unit, the ADC including a comparator that compares the electrical signal with the reference signal, and a counter that counts time necessary for a change of the reference signal to a coincidence of the electrical signal and the reference signal on the basis of the output signals from the comparator, the comparator including the differential amplifier that outputs the comparison result signal indicating a comparison result obtained by comparing the electrical signal and the reference signal, and the plurality of output amplifiers that outputs signals obtained by amplifying the comparison result signal output from the differential amplifier as the output signals.

<7>

An electronic apparatus, including:

an optical system that collects light; and an image sensor that receives light and takes an image, in which the image sensor includes a pixel that has a photoelectric conversion element for performing photoelectric conversion and outputs an electrical signal, a reference signal output unit that outputs a reference signal, a level of which is changed, and an ADC that performs AD (Analog Digital) conversion for the electrical signal by counting time necessary for a change of the reference signal to a coincidence of the electrical signal output from the pixel and the reference signal output from the reference signal output unit, the ADC includes a comparator that compares the electrical signal with the reference signal, and a counter that counts time necessary for a change of the reference signal to a coincidence of the electrical signal and the reference signal on the basis of output signals from the comparator, and the comparator includes a differential amplifier that outputs a comparison result signal indicating a comparison result obtained by comparing the electrical signal and the reference signal, and a plurality of output amplifiers that outputs, at different timings, signals obtained by amplifying the comparison result signal output from the differential amplifier as the output signals.

<8>

A comparator, including:

a differential amplifier that outputs a comparison result signal indicating a comparison result obtained by comparing two signals; and a plurality of output amplifiers that outputs signals obtained by amplifying the comparison result signal output from the differential amplifier at different timings.

DESCRIPTION OF SYMBOLS 1 optical system, 2 image sensor, 3 memory, 4 signal processing unit, 5 output unit, 6 control unit, 10 pixel array, $11_{1,1}$ to $11_{M,N}$ pixel, 20 control unit, 21 pixel drive unit, 22 column-parallel AD conversion unit, $31_1$ to $31_N$ ADC, 32 auto-zero control unit, 32A auto-zero control line, 33 reference signal output unit, 33A reference signal line, 34 clock output unit, 34A clock line, $41_1$ to $41_M$ pixel control line, $42_1$ to $42_N$ VSL, $43_1$ to $43_N$ current source, 51 PD, 52 transfer Tr, 53 FD, 54 reset Tr, 55 amplification Tr, 56 selection Tr, $61_1$ to $61_N$ comparator, $62_1$ to $62_N$ counter, $63_1$ to $63_N$ comparator, $64_1$ to $64_N$ counter, $65_1$ to $65_N$ logic circuit, 71 differential amplifier, 72 output amplifier, 81 to 84 FET, 85, 86 switch, 87, 88 capacitor, 89 current source, 91, 92 FET, 93 switch, 94 capacitor, $101_1$ to $101_N$ comparator, 111 output amplifier, 121, 122 FET, 123 switch, 124 capacitor, 131 timing control unit, 132 FET, 133 switch, 134 capacitor, 141 OR gate, 142, 143 NAND gate

The invention claimed is:

1. An imaging device, comprising:
a pixel configured to output a pixel signal;
a signal line coupled to the pixel;
a first differential amplifier configured to:
  compare the pixel signal and a reference signal; and
  output a first differentiation signal,
  wherein the first differential amplifier includes:
    a first differential transistor coupled to the signal line;
    a second differential transistor coupled to a reference signal generation circuit configured to output the reference signal; and
    a first output node coupled to each of the first differential transistor and the second differential transistor;
a first amplifier coupled to the first differential amplifier, wherein the first amplifier includes:
  a first transistor, wherein a first gate of the first transistor is coupled to the first output node; and
  a second output node coupled to the first transistor;
a second amplifier coupled to the first differential amplifier,
  wherein the second amplifier includes:
    a second transistor, wherein a second gate of the second transistor is coupled to the first output node; and
    a third output node coupled to the second transistors;
a first counter coupled to the first amplifier; and
a second counter coupled to the second amplifier.

2. The imaging device according to claim 1, wherein one of a first source of the first transistor or a first drain of the first transistor is coupled to a first potential.

3. The imaging device according to claim 1,
wherein one of a first source of the first differential transistor or a first drain of the first differential transistor is coupled to a first potential, and
wherein other of the first source of the first differential transistor or the first drain of the first differential transistor is coupled to a second potential.

4. The imaging device according to claim 3, wherein the first potential is a ground and the second potential is a power source potential.

5. The imaging device according to claim 2, wherein the first amplifier further includes a third transistor coupled to other of the first source of the first transistor or the first drain of the first transistor.

6. The imaging device according to claim 5, wherein the third transistor is coupled to a second potential.

7. The imaging device according to claim 6, wherein the first potential is a power source potential and the second potential is a ground.

8. The imaging device according to claim 6, wherein one of a second source of the second transistor or a second drain of the second transistor is coupled to the first potential.

9. The imaging device according to claim 8, wherein the second amplifier further includes a fourth transistor coupled to other of the second source of the second transistor or the second drain of the second transistor.

10. The imaging device according to claim 9, wherein the fourth transistor is coupled to the second potential.

11. The imaging device according to claim 10, wherein the first potential is a power source potential and the second potential is a ground.

12. The imaging device according to claim 1, wherein a first channel type of the first differential transistor and the second differential transistor is different than a second channel type of the first transistor and the second transistor.

13. An electronic apparatus, comprising:
   an optical system; and
   an imaging device, wherein the imaging device comprises:
      a pixel configured to output a pixel signal;
      a signal line coupled to the pixel;
      a first differential amplifier configured to:
         compare the pixel signal and a reference signal; and
         output a first differentiation signal,
         wherein the first differential amplifier includes:
            a first differential transistor coupled to the signal line;
            a second differential transistor coupled to a reference signal generation circuit configured to output the reference signal; and
            a first output node coupled to each of the first differential transistor and the second differential transistor;
      a first amplifier coupled to the first differential amplifier,
         wherein the first amplifier includes:
            a first transistor, wherein a first gate of the first transistor is coupled to the first output node; and
            a second output node coupled to the first transistor;
      a second amplifier coupled to the first differential amplifier, wherein the second amplifier includes:
         a second transistor, wherein a second gate of the second transistor coupled to the first output node; and
         a third output node coupled to the second transistors;
      a first counter coupled to the first amplifier; and
      a second counter coupled to the second amplifier.

14. The electronic apparatus according to claim 13, wherein one of a first source of the first transistor or a first drain of the first transistor is coupled to a first potential.

15. The electronic apparatus according to claim 13,
   wherein one of a first source of the first differential transistor or a first drain of the first differential transistor is coupled to a first potential, and
   wherein other of the first source of the first differential transistor or the first drain of the first differential transistor is coupled to a second potential.

16. The electronic apparatus according to claim 15, wherein the first potential is a ground and the second potential is a power source potential.

17. The electronic apparatus according to claim 14, wherein the first amplifier further includes a third transistor coupled to other of the first source of the first transistor or the first drain of the first transistor.

18. The electronic apparatus according to claim 17, wherein the third transistor is coupled to a second potential.

19. The electronic apparatus according to claim 18, wherein the first potential is a power source potential and the second potential is a ground.

20. The electronic apparatus according to claim 18, wherein one of a second source of the second transistor or a second drain of the second transistor is coupled to the first potential.

21. The electronic apparatus according to claim 20, wherein the second amplifier further includes a fourth transistor coupled to other of the second source of the second transistor or the second drain of the second transistor.

22. The electronic apparatus according to claim 21, wherein the fourth transistor is coupled to the second potential.

23. The electronic apparatus according to claim 22, wherein the first potential is a power source potential and the second potential is a ground.

24. The electronic apparatus according to claim 13, wherein a first channel type of the first differential transistor and the second differential transistor is different than a second channel type of the first transistor and the second transistor.

* * * * *